US007334168B2

(12) United States Patent
Kai et al.

(10) Patent No.: US 7,334,168 B2
(45) Date of Patent: Feb. 19, 2008

(54) SEMICONDUCTOR INTEGRATED CIRCUIT WHICH PROPERLY EXECUTES AN OPERATIONAL TEST OF A CIRCUIT UNDER TEST IN THE SEMICONDUCTOR INTEGRATED CIRCUIT

(75) Inventors: Yasukazu Kai, Miyazaki (JP); Yoshihiro Nakatake, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 172 days.

(21) Appl. No.: 11/090,293

(22) Filed: Mar. 28, 2005

(65) Prior Publication Data
US 2005/0229065 A1 Oct. 13, 2005

Related U.S. Application Data

(63) Continuation-in-part of application No. 10/990,430, filed on Nov. 18, 2004.

(30) Foreign Application Priority Data

Apr. 1, 2004 (JP) ............................. 2004-109086

(51) Int. Cl.
*G06K 5/04* (2006.01)
(52) U.S. Cl. ...................................... 714/700
(58) Field of Classification Search ................ 714/700, 714/744
See application file for complete search history.

(56) References Cited

U.S. PATENT DOCUMENTS 5,825,712 A * 10/1998 Higashi et al. ........ 365/230.03

FOREIGN PATENT DOCUMENTS

JP 2001153930 6/2001
JP 2003256495 9/2003

* cited by examiner

*Primary Examiner*—James C. Kerveros
(74) *Attorney, Agent, or Firm*—Volentine & Whitt, P.L.L.C.

(57) ABSTRACT

A semiconductor integrated circuit includes a circuit under test coupled to the logic circuit to receive a plurality internal test signals and a delay time measurement terminal from which a delay time measurement signal is output. The delay time measurement signal is turned in accordance with a transition of one of the internal test signal. The semiconductor integrated circuit further includes a current generator coupled to the delay time measurement terminal, and still further includes a plurality of delay time measurement transistors coupled to the delay time measurement terminal. The delay time measurement transistors have a plurality of control electrodes coupled to the logic circuit to receive the internal test signals. Alternatively, the semiconductor integrated circuit may include an input switching circuit coupled between the logic circuit and the CUT and a pseudo test terminal coupled to the CUT and the logic circuit.

8 Claims, 13 Drawing Sheets

SEMICONDUCTOR INTEGRATED CIRCUIT WHICH PROPERLY EXECUTES AN OPERATIONAL TEST OF A CIRCUIT UNDER TEST IN THE SEMICONDUCTOR INTEGRATED CIRCUIT

CROSS-REFERENCE TO RELATED APPLICATIONS

This is a continuation-in-part (CIP) of, and a claim of priority is made to, U.S. non-provisional patent application Ser. No. 10/990,430, filed Nov. 18, 2004, the entire contents of which are incorporated herein by reference.

BACKGROUND OF THE INVENTION

1. Field of the Invention

The present invention relates to a semiconductor integrated circuit that executes an operational test of itself, in particular, to a semiconductor integrated circuit that includes different integrated circuit blocks mixed therein and which executes the operational test with respect to one of the mixed different integrated circuits. This is a counterpart of and claims priority to Japanese Patent Application No. 2004-109086 filed on Apr. 1, 2004, which is herein incorporated by reference.

2. Description of the Related Art

A mixed circuit which includes a logic circuit and a memory circuit (for example, a Dynamic Random Access Memory (DRAM) circuit), or a system Large Scale Integrated (hereinafter referred to as "LSI") circuit which includes different integrated circuits such as a DRAM, a Static Random Access Memory (SRAM), a Read only Memory (ROM) and a central Processing Unit (CPU) has been developed as a result of improvements made in design and manufacturing techniques.

The above-mentioned circuit may include an internal circuit that is externally accessed through another circuit during a normal operational mode of the circuit. FIG. 1 is a block diagram for describing a logic memory mixed circuit 700A of the related art. The logic memory mixed circuit 700A includes a memory circuit 710A that is coupled to external input-output pads 730 through a logic circuit 720A. That is, an external input signal is initially input to the logic circuit 720A and then an internal input signal generated by the logic circuit 720A is transferred to an internal input terminal of the memory circuit 710A. Likewise, an internal output signal generated by the memory circuit 710A is transferred to the external input-output pad 730 through the logic circuit 720A. When an operational test is executed only against the memory circuit 710A, an external test signal received by the external input-output pad 730 needs to be directly provided to the memory circuit 710A.

FIG. 2 is a circuit block diagram for describing a semiconductor integrated circuit 700B of another related art. The semiconductor integrated circuit 700B includes a logic circuit 720B coupled between external input pads 731 through 733 and internal input terminals 711 through 713 of a memory circuit 710B. The logic circuit 720B includes a plurality of sub-logic circuits 721 coupled with each other by interconnections 722. In order to provide external test signals eTCK, eTWE and eTRE directly to the memory circuit 710B, the logic circuit 720B includes selection circuits. The external test signals can be directly provided to the memory circuit 710B without passing through the sub-logic circuits 721 of the logic circuit 720B by switching the selection circuits.

However, in the semiconductor integrated circuit 700B as shown in FIG. 2, the number of the sub-logic circuits 721 and the length of the interconnections 722 between the external input pads 731 through 733 and the internal input terminals 711 through 713 are different than each other. For example, the number of the sub-logic circuits 721 between the external input pads 731 and the internal input terminals 711 is different than the number of sub-logic circuits 721 between the external input pads 732 and the internal input terminals 712. Also, the length of the interconnection between the external input pads 731 and the internal input terminals 711 is different than the length of the interconnection between the external input pads 732 and the internal input terminals 712. Thus, delay times caused by the logic circuit 720B may be different among the external test signals eTCK, eTWE and eTRE. Therefore, even though the external test signals eTCK, eTWE and eTRE are input to the external input pads 731 through 733 in accordance with a desired input timing of signals in the memory circuit 710B, internal test signals iTCK, iTWE and iTRE generated by the logic circuit 720B may not be provided to the memory circuit 710B in accordance with the desired input of signals in the memory circuit 710B. That is, there are different delay times among the internal test signals iTCK, iTWE and iTRE. As a result, the operational test may not be properly executed in the memory circuit 710B of the semiconductor integrated circuit 700B. In order to suppress the disadvantage with respect to the operational test, the external test signals eTCK, eTWE and eTRE may be input to the external input pads 731 through 733 previously with the different delay times of the internal test signals iTCK, iTWE and iTRE. Therefore, it is necessary that the different delay times of the internal test signals iTCK, iTWE and iTRE are exactly measured to improve the reliability of the operational test.

The following first and second measuring techniques for the delay times of the external test signals are disclosed.

The delay times of the external test signals are directly measured using a needle pico-probe and an oscilloscope in the first measuring technique. In this technique, after the needle pico-probes contact the external input pads 731 through 733 and the internal input terminals 711 through 713, voltage waveforms of the external input pads 731 through 733 and the internal input terminals 711 through 713 are detected by the oscilloscope. Then, the delay times of the external test signals can be obtained based on the voltage waveforms.

Also, the second measuring technique is described in a Patent Document 1 (Japanese Patent Publication Laid-open No. 2001-153930), in particular, in the paragraph [0036] through [0042] of the Document 1. In the second measuring technique, interconnections are constructed so that the external test signals input to test signal input pads can be output from test signal output pads through an under-test circuit (for example, the memory circuit 710B) as test result signals. Then, the delay times of the test result signals are measured. As a result, the delay times of the external test signals can be obtained.

However, in the first measuring technique, an operator needs to manually make the needle pico-probe contact the external input pads 731 through 733 and the internal input terminals 711 through 713, and it takes a long time for the operational test to be executed. Furthermore, it is hard for the operator to execute the operational test under a condition of high temperature. Therefore, the measurement results may not be always correct. Also, in the second measuring technique, a large-scaled test circuit (the test control circuit 5 described in the Document 1) and test interconnections (the test bus 2 described in the Document 1) need to be used for the operational test. Therefore, the size of the semiconductor integrated circuit becomes large.

Meanwhile, consumption current of the semiconductor integrated circuit may be measured in the operational test. For example, the following consumption current measuring technique is disclosed as the related art in a Patent Document 2 (Japanese Patent Publication Laid-open No. 2003-256495). In this measuring technique, the consumption current of the semiconductor integrated circuit is detected using an RT radioimmunoassary test and test patterns. However, the consumption current only in the memory circuit 710B as described in FIG. 1 may not be detected by the consumption current measuring technique described in the Document 2.

SUMMARY OF THE INVENTION

An object of the present invention is to exactly measure a difference between the different delay times of the internal test signals and to exactly measure the consumption current only in the under-test circuit.

According to an aspect of the present invention, for achieving the above-mentioned object, there is provided a semiconductor integrated circuit which includes a plurality of external input terminals which receives a plurality of external test signals and includes a logic circuit which is coupled to the external input terminals. The logic circuit outputs a plurality of internal test signals based on the external test signals. The semiconductor integrated circuit further includes a circuit under test which is coupled to the logic circuit to receive the internal test signals, and includes a delay time measurement terminal from which a delay time measurement signal is output. The delay time measurement signal is turned in accordance with a transition of one of the internal test signal. The semiconductor integrated circuit still further includes a current generator which is coupled between a first electrical source terminal and the delay time measurement terminal, and includes a plurality of delay time measurement transistors which are coupled in parallel between the delay time measurement terminal and a second electrical source terminal. The delay time measurement transistors have a plurality of control electrodes which are coupled to the logic circuit to receive the internal test signals.

According to another aspect of the present invention, for achieving the above-mentioned object, there is provided a semiconductor integrated circuit, operable normal operational mode and a test mode, which includes a plurality of external input terminals and a logic circuit coupled to the external input terminals. The logic circuit receives a plurality of external signals through the external input terminals to output a plurality of internal input signals. The semiconductor integrated circuit further includes a circuit under test (CUT) coupled to the logic circuit to receive the internal input signals and includes an input switching circuit coupled between the logic circuit and the CUT. The CUT generates an internal output signal for the logic circuit when the semiconductor integrated circuit operates in the normal operational mode. The input switching circuit prohibits the CUT from receiving the internal input signals when the semiconductor integrated circuit operates in the test mode. The semiconductor integrated circuit still further includes a pseudo test terminal coupled to the CUT and the logic circuit. A pseudo test signal is input to the logic circuit through the pseudo test terminal when the CUT is prohibited from receiving the internal input signals.

According to the other aspect of the present invention, for achieving the above-mentioned object, there is provided a semiconductor integrated circuit, operable normal operational mode and a test mode, which includes a plurality of external input terminals and a logic circuit coupled to the external input terminals. The logic circuit receives a plurality of external signals through the external input terminals to output a plurality of internal input signals. The internal signals include a data input signal. The semiconductor integrated circuit further includes a circuit under test (CUT) coupled to the logic circuit to receive the internal input signals and includes an input switching circuit coupled between the logic circuit and the CUT. The CUT generates an internal output signal for the logic circuit when the semiconductor integrated circuit operates in the normal operational mode. The input switching circuit prohibits the CUT from receiving the internal input signals when the semiconductor integrated circuit operates in the test mode. The semiconductor integrated circuit still further includes a pseudo test signal generating circuit coupled to the logic circuit to receive the data input signal. The pseudo test signal generating circuit provides a pseudo test signal to the logic circuit based on the data input signal when the CUT is prohibited from receiving the internal input signals.

The above and further aspects and novel features of the invention will more fully appear from the following detailed description, appended claims and the accompanying drawings.

DETAILED DESCRIPTION OF THE PREFERRED EMBODIMENTS

Embodiments of the present invention will be described hereinafter with references to the accompanying drawings. The drawings used for this description illustrate major characteristic parts of embodiments in order that the present invention will be easily understood. However, the invention is not limited by these drawings.

Figure 1:
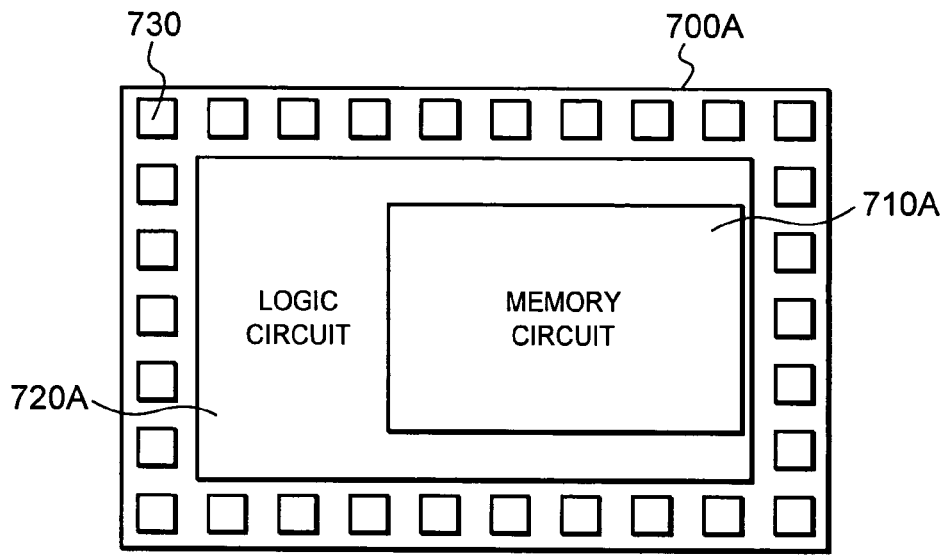
FIG. 1 is a block diagram for describing a logic memory mixed circuit 700A of the related art.
Figure 2:
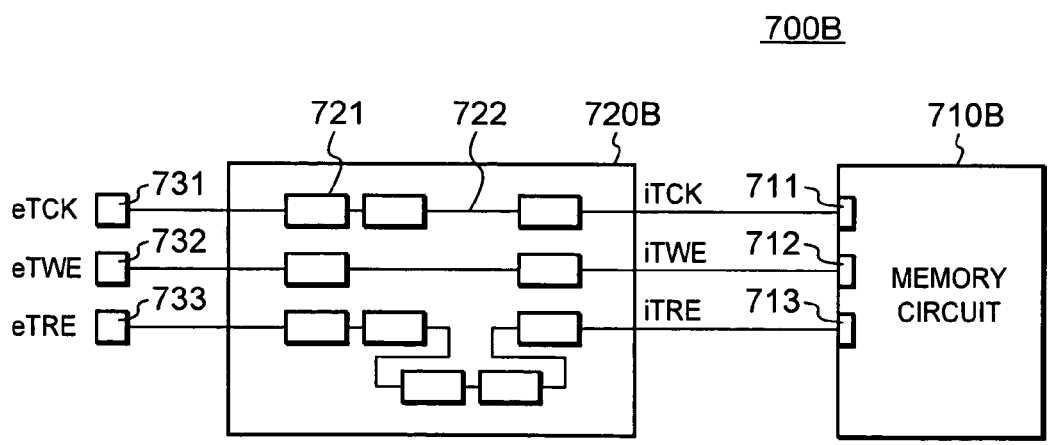
FIG. 2 is a circuit block diagram for describing a semiconductor integrated circuit 700B of another related art.
Figure 3:
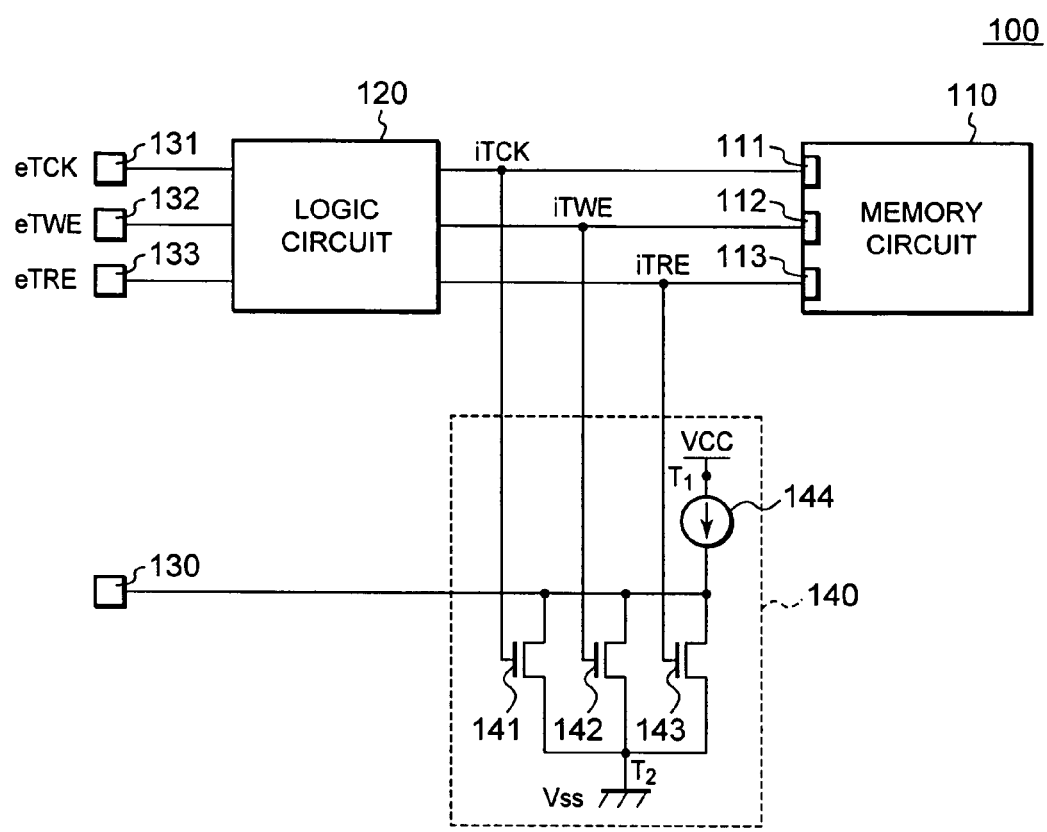
FIG. 3 is a schematic circuit diagram for describing a semiconductor integrated circuit according to a first preferred embodiment of the present invention.

FIG. 3 is a schematic circuit diagram for describing a semiconductor integrated circuit 100 according to a first preferred embodiment of the present invention. The semiconductor integrated circuit 100 includes a memory circuit 110, a logic circuit 120, a plurality of external input terminals 131 through 133, a delay time measurement circuit 140 and a delay time measurement terminal 130. In this example, the memory circuit 110 is a circuit under test (hereinafter referred as to a "CUT").

The memory circuit 110 includes a plurality of internal input terminals 111 through 113 that respectively receive internal input signals. In this example, these internal input signals include an internal clock signal iCK, an internal write enable signal iWE and an internal read enable signal iRE.

The logic circuit 120 includes a peripheral circuit such as an input-output circuit with respect to the memory circuit 110. The logic circuit 120 outputs the internal input signals based on a plurality of external input signals that have been input to the external input terminals 131 through 133.

Hereupon, during a normal operational mode of the semiconductor integrated circuit 100, the external input signals include an external clock signal eCK, an external write enable signal eWE and an external read enable signal eRE. That is, the logic circuit 120 generates the internal clock signal iCK, the internal write enable signal iWE and the internal read enable signal iRE based on the external clock signal eCK, the external write enable signal eWE and the external read enable signal eRE for the internal input terminals 131 through 133 of the memory circuit 110.

On the other hand, during an operational test mode of the semiconductor integrated circuit 100, the logic circuit 120 receives a plurality of external input test signals and then provides them straight to the internal input terminals 111 through 113 of the memory circuit 110 as a plurality of internal input test signals. In this example, the external input test signals include an external test clock signal eTCK, an external test write enable signal eTWE and an external test read enable signal eTRE, and the internal input test signals include an internal test clock signal iTCK, an internal test write enable signal iTWE and an internal test read enable signal iTRE. That is, the logic circuit 120 receives the external test clock signal eTCK, the external test write enable signal eTWE and the external test read enable signal eTRE and then provides them straight to the internal input terminals 111 through 113 of the memory circuit 110 as the internal test clock signal iTCK, the internal test write enable signal iTWE and the internal test read enable signal iTRE. Also, delay times between the internal input test signals and the external input test signals may be different than one another. For example, the clock delay time CKDT between the internal test clock signal iTCK and the external test clock signal eTCK is different than the write enable delay time WEDT between the internal test write enable signal iTWE and the external test write enable signal eTWE and the read enable delay time REDT between the internal test read enable signal iTRE and the external test read enable signal eTRE, and the write enable delay time WEDT is different than the read enable delay time REDT.

The delay time measurement circuit 140 detects the clock delay time CKDT, the write enable delay time WEDT and the read enable delay time REDT. The delay time measurement circuit 140 is coupled between a first electrical source terminal T1 and a second electrical source terminal T2 and includes a plurality of delay time measurement NMOS transistors 141 through 143 and a current generator 144. In this example, the first electrical source terminal T1 receives a power supply voltage Vcc and the second electrical source terminal T2 receives a ground voltage Vss. The clock delay time measurement NMOS transistor 141 includes a source electrode coupled to the second electrical source terminal T2, a drain electrode coupled to the delay time measurement terminal 130, and a gate electrode coupled to the internal input terminal 111 so as to receive the internal test clock signal iTCK. The write enable delay time measurement NMOS transistor 142 includes a source electrode coupled to the second electrical source terminal T2, a drain electrode coupled to the delay time measurement terminal 130, and a gate electrode coupled to the internal input terminal 112 so as to receive the internal test write enable signal iTWE. The read enable delay time measurement NMOS transistor 143 includes a source electrode coupled to the second electrical source terminal T2, a drain electrode coupled to the delay time measurement terminal 130, and a gate electrode coupled to the internal input terminal 113 so as to receive the internal test read enable signal iTRE. The current generator 144 is coupled between the first electrical source terminal T1 and the delay time measurement terminal 130. The current generator 144 provides a pull-up voltage to the delay time measurement terminal 130 based on the power supply voltage Vcc. The current generator 144 may be outside of the semiconductor integrated circuit 100. As stated above, the delay time measurement NMOS transistors 141 through 143 respectively have open drain electrodes and are coupled in parallel with one another between the delay time measurement terminal 130 and the second electrical source terminal T2. That is, the delay time measurement NMOS transistors 141 through 143 constitute a wired NOR circuit in order to pull up an electrical potential of the delay time measurement terminal 130. The electrical potential of the delay time measurement terminal 130 is output from the delay time measurement terminal 130 as a delay time measurement signal Sdt.

Figure 4:
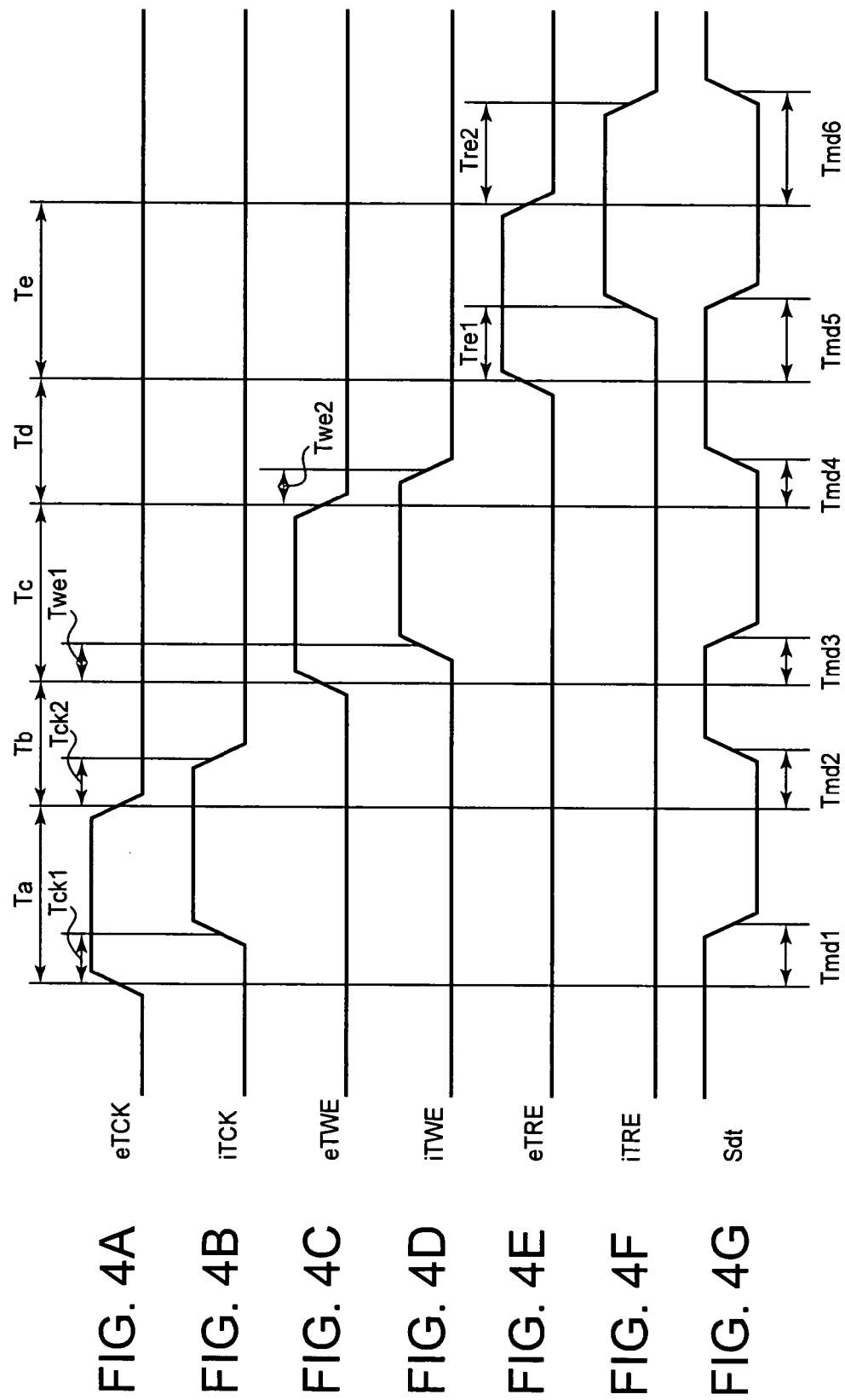
FIGS. 4A through 4G are signal waveform diagrams for describing the operation of the semiconductor integrated circuit in FIG. 3.

The operation of the semiconductor integrated circuit 100 according to the first preferred embodiment of the present invention is described below. FIGS. 4A through 4G are signal waveform diagrams for describing the operation of the semiconductor integrated circuit 100 in FIG. 3. FIG. 4A represents a waveform of the external test clock signal eTCK, FIG. 4B represents a waveform of the internal test clock signal iTCK, FIG. 4C represents a waveform of the external test write enable signal TWE, FIG. 4D represents a waveform of the internal test write enable signal iTWE, FIG. 4E represents a waveform of the external test read enable signal TRE, FIG. 4F represents a waveform of the internal test read enable signal iTRE, and FIG. 4G represents a waveform of the delay time measurement signal Sdt.

First of all, when the external test clock signal eTCK, the external test write enable signal eTWE and the external test read enable signal eTRE are kept at a "Low" level (hereinafter referred to as "L" level) as shown in FIGS. 4A, 4C and 4E, the internal test clock signal iTCK, the internal test write enable signal iTWE and the internal test read enable signal iTRE are also kept at the "L" level as shown in FIGS. 4B, 4D and 4F. That is, the when electrical potentials of the external input terminals 131 through 133 are kept at the "L" level, electrical potentials of the internal input terminal 111 through 113. Accordingly, the gate electrodes of the delay time measurement NMOS transistors 141 through 143 respectively receive the internal test signals that are kept at the "L" level. Also, the source electrodes of the delay time measurement NMOS transistors 141 through 143 respectively receive the ground voltage Vss. Therefore, the delay time measurement NMOS transistors 141 through 143 are all turned OFF. On such an occasion as this, the electrical potential of the delay time measurement terminal 130 is pulled-up by the current generator 144. That is, the delay time measurement signal Sdt is kept at the "High" level (hereinafter referred to as "H" level) as shown in FIG. 4G.

Next, the external test clock signal eTCK is turned to the "H" level while the external test write enable signal eTWE and the external test read enable signal eTRE are kept at the "L" level as shown in FIG. 4A. Then, the internal test clock signal iTCK is turned to the "H" level behind the rising edge of the external test clock signal eTCK by a clock rising delay time Tck1 as shown in FIG. 4B. Therefore, the clock delay time measurement NMOS transistor 141 is turned ON, and then the electrical potential of the delay time measurement terminal 130 is turned to the "L" level as shown in FIG. 4G. That is, the electrical potential of the delay time measurement terminal 130 is turned to the "L" level behind the rising edge of the external test clock signal eTCK by a first measurement delay time Tmd1 as shown in FIG. 4G. Then, the external test clock signal eTCK is turned to the "L" level behind the rising edge of the external test clock signal eTCK by a first predetermined time Ta as shown in FIG. 4A. The internal test clock signal iTCK is turned to the "L" level behind the trailing edge of the external test clock signal eTCK by a clock trailing delay time Tck2 as shown in FIG. 4B. Therefore, the clock delay time measurement NMOS transistor 141 is turned OFF, and then the electrical potential of the delay time measurement terminal 130 is turned to the "H" level as shown in FIG. 4G. That is, the delay time measurement signal Sdt is turned to the "H" level behind the trailing edge of the external test clock signal eTCK by a second measurement delay time Tmd2.

Next, the external test write enable signal TWE is turned to the "H" level behind the trailing edge of the external test clock signal eTCK by a second predetermined time Tb, while the external test clock signal eTCK and the external test read enable signal eTRE are kept at the "L" level as shown in FIG. 4C. Then, the internal test write enable signal iTWE is turned to the "H" level behind the rising edge of the external test write enable signal eTWE by a write enable rising delay time Twe1 as shown in FIG. 4D. Therefore, the write enable delay time measurement NMOS transistor 142 is turned ON, and then the electrical potential of the delay time measurement terminal 130 is turned to the "L" level as shown in FIG. 4G. That is, the electrical potential of the delay time measurement terminal 130 is turned to the "L" level behind the rising edge of the external test write enable signal eTWE by a third measurement delay time Tmd3. The external test write enable signal eTWE is turned to the "L" level behind the rising edge of the external test write enable signal eTWE by a third predetermined time Tc as shown in FIG. 4C. The internal test write enable signal iTWE is turned to the "L" level behind the trailing edge of the external test write enable signal eTWE by a write enable trailing delay time Twe2 as shown in FIG. 4D. Therefore, the write enable delay time measurement NMOS transistor 142 is turned OFF, and then the electrical potential of the delay time measurement terminal 130 is turned to the "H" level as shown in FIG. 4G. That is, the electrical potential of the delay time measurement terminal 130 is turned to the "H" level behind the trailing edge of the external test write enable signal eTWE by a fourth measurement delay time Tmd4.

Furthermore, the external test read enable signal eTRE is turned to the "H" level behind the trailing edge of the external test write enable signal eTWE by a fourth predetermined time Td, while the external test clock signal TCLK and the external test write enable signal eTWE are kept at the "L" level as shown in FIG. 4E. Then, the internal test read enable signal iTRE is turned to the "H" level behind the rising edge of the external test read enable signal eTRE by a read enable rising delay time Tre1 as shown in FIG. 4F. Therefore, the read enable delay time measurement NMOS transistor 143 is turned ON, and then the electrical potential of the delay time measurement terminal 130 is turned to the "L" level as shown in FIG. 4G. That is, the electrical potential of the delay time measurement terminal 130 is turned to the "L" level behind the rising edge of the external test read enable signal eTRE by a fifth measurement delay time Tmd5. The external test read enable signal eTRE is turned to the "L" level behind the rising edge of the external test read enable signal eTRE by a fifth predetermined time Te as shown in FIG. 4E. The internal test read enable signal iTRE is turned to the "L" level behind the trailing edge of the external test read enable signal TRE by a read enable trailing delay time Tre2 as shown in FIG. 4F. Therefore, the read enable delay time measurement NMOS transistor 143 is turned OFF, and then the electrical potential of the delay time measurement terminal 130 is turned to the "H" level as shown in FIG. 4G. That is, the electrical potential of the delay time measurement terminal 130 is turned to the "L" level behind the trailing edge of the external test read enable signal eTRE by a sixth measurement delay time Tmd6. The measurements of the delay times of the internal test clock signal iTCK, the internal test write enable signal iTWE and the internal test read enable signal iTRE are executed as stated above.

The calculation method of a time difference between the delay times with respect to the different internal test signals is described below.

Initially, a calculation method of the time difference between the delay times with respect to the rising edge of the internal test clock signal iTCK and the rising edge of the internal test write enable signal iTWE is described in detail. A delay time between rising edges of signals with respect to the external output terminal 131 and the internal input terminal 111 corresponds with the clock rising delay time Tck1 which indicates the delay time of the rising edge of the internal test clock signal iTCLK against the rising edge of the external test clock signal eTCK. Also, a delay time between rising edges of signals with respect to the external output terminal 132 and the internal input terminal 112 corresponds with the write enable rising delay time Twe1 which indicates the delay time of the rising edge of the internal test write enable signal iTWE against the rising edge of the external test write enable signal eTWE. Accordingly, the time difference between the delay times with respect to the rising edge of the internal test clock signal iTCK and the rising edge of the internal test write enable signal iTWE may be expressed by a difference between the clock rising delay time Tck1 and the write enable rising delay time Twe1. However, the clock rising delay time Tck1 and the write enable rising delay time Twe1 may not be directly measured. Meanwhile, a delay time between the rising edge of the internal test clock signal iTCK and the first trailing edge of the delay time measurement signal Sdt approximately corresponds with a delay time between the rising edge of the internal test write enable signal iTWE and the second trailing edge of the delay time measurement signal Sdt. That is, a time difference between the first measurement delay time Tmd1 and the clock rising delay time Tck1 approximately corresponds with a time difference between the third measurement delay time Tmd3 and the write enable rising delay time Twe1. Therefore, a time difference between the clock rising delay time Tck1 and the write enable rising delay time Twe1 corresponds with a time difference between the first measurement delay time Tmd1 and the third measurement delay time Tmd3. Accordingly, the time difference between the delay times with respect to the rising edge of the internal test clock signal iTCK and the rising edge of the internal test write enable signal iTWE is calculated by the first measurement delay time Tmd1 and the third measurement delay time Tmd3.

The calculation method of the time difference between the delay times with respect to the rising edge of the internal test clock signal iTCK and the rising edge of the internal test read enable signal iTRE is described in detail. As described above, the delay time with respect to the rising edge of the signal between the external input terminal 131 and the internal input terminal 111 corresponds with the clock rising delay time Tck1. Also, a delay time between rising edges of signals with respect to the external output terminal 113 and the internal input terminal corresponds with the read enable rising delay time Tre1 which indicates the delay time of the rising edge of the internal test read enable signal iTRE against the rising edge of the external test read enable signal eTRE. Accordingly, the time difference between the delay times with respect to the rising edge of the internal test clock signal iTCK and the rising edge of the internal test read enable signal iTRE may be expressed by a difference between the clock rising delay time Tck1 and the read enable rising delay time Tre1. However, the clock rising delay time Tck1 and the read enable rising delay time Tre1 may not be directly measured. Meanwhile, the delay time between the rising edge of the internal test clock signal iTCK and the first trailing edge of the delay time measurement signal Sdt approximately corresponds with a delay time between the rising edge of the internal test read enable signal iTRE and the third trailing edge of the delay time measurement signal Sdt. That is, the time difference between the first measurement delay time Tmd1 and the clock rising delay time Tck1 approximately corresponds with a time difference between the fifth measurement delay time Tmd5 and the read enable rising delay time Tre1. Therefore, a time difference between the clock rising delay time Tck1 and the read enable rising delay time Twe1 corresponds with a time difference between the first measurement delay time Tmd1 and the fifth measurement delay time Tmd5. Accordingly, the time difference between the delay times with respect to the rising edge of the internal test clock signal iTCK and the rising edge of the internal test read enable signal iTRE is calculated by the first measurement delay time Tmd1 and the fifth measurement delay time Tmd5.

Next, the calculation method of an elapsed time from the rising edge of the internal test clock signal iTCK till the trailing edge of the internal test write enable signal iTWE is described in detail. In this case, the elapsed time may be expressed by a sum of the first predetermined time Ta except the clock rising delay time Tck1, the second predetermined time Tb, the third predetermined time Tc and the write enable trailing delay time Twe2. Hereupon, as described above, the delay time between the rising edges of the signals with respect to the external output terminal 131 and the internal input terminal 111 corresponds with the clock rising delay time Tck1. Also, a delay time between trailing edges of signals with respect to the external output terminal 132 and the internal input terminal 112 corresponds with the write enable trailing delay time Twe2 which indicates the delay time of the trailing edge of the internal test write enable signal iTWE against the trailing edge of the external test write enable signal eTWE. Accordingly, the time difference between the delay times with respect to the rising edge of the internal test clock signal iTCK and the trailing edge of the internal test write enable signal iTWE may be expressed by a difference between the clock rising delay time Tck1 and the write enable trailing delay time Twe2. However, the clock rising delay time Tck1 and the write enable trailing delay time Twe2 may not be directly measured. Meanwhile, the delay time between the rising edge of the internal test clock signal iTCK and the first trailing edge of the delay time measurement signal Sdt approximately corresponds with a delay time between the trailing edge of the internal test write enable signal iTWE and the second rising edge of the delay time measurement signal Sdt. That is, the time difference between the first measurement delay time Tmd1 and the clock rising delay time Tck1 approximately corresponds with a time difference between the fourth measurement delay time Tmd4 and the write enable trailing delay time Twe2. Therefore, a time difference between the clock rising delay time Tck1 and the write enable trailing delay time Twe2 corresponds with a time difference between the first measurement delay time Tmd1 and the fourth measurement delay time Tmd4. Accordingly, the elapsed time from the rising edge of the internal test clock signal iTCK till the trailing edge of the internal test write enable signal iTWE can be calculated by a sum of the first predetermined time Ta except the first measurement delay time Tmd1, the second predetermined time Tb, the third predetermined time Tc and the fourth measurement delay time Tmd4.

The calculation method of an elapsed time from the rising edge of the internal test clock signal iTCK till the trailing edge of the internal test read enable signal iTRE is described in detail. In this case, the elapsed time may be expressed by a sum of the first predetermined time Ta except the clock rising delay time Tck1, the second predetermined time Tb, the third predetermined time Tc, the fourth predetermined time Td, the fifth predetermined time Te and the read enable trailing delay time Tre2. Hereupon, as described above, the delay time between the rising edges of the signals with respect to the external output terminal 131 and the internal input terminal 111 corresponds with the clock rising delay time Tck1. Also, a delay time between trailing edges of signals with respect to the external output terminal 133 and the internal input terminal 1 13 corresponds with the read enable trailing delay time Tre2 which indicates the delay time of the trailing edge of the internal test read enable signal iTRE against the trailing edge of the external test read enable signal eTRE. Accordingly, the time difference between the delay times with respect to the rising edge of the internal test clock signal iTCK and the trailing edge of the internal test read enable signal iTRE may be expressed by a difference between the clock rising delay time Tck1 and the read enable trailing delay time Tre2. However, the clock rising delay time Tck1 and the read enable trailing delay time Tre2 may not be directly measured. Meanwhile, the delay time between the rising edge of the internal test clock signal iTCK and the first trailing edge of the delay time measurement signal Sdt approximately corresponds with a delay time between the trailing edge of the internal test read enable signal iTRE and the second rising edge of the delay time measurement signal Sdt. That is, the time difference between the first measurement delay time Tmd1 and the clock rising delay time Tck1 approximately corresponds with a time difference between the sixth measurement delay time Tmd6 and the read enable trailing delay time Tre2. Therefore, a time difference between the clock rising delay time Tck1 and the read enable trailing delay time Tre2 corresponds with a time difference between the first measurement delay time Tmd1 and the sixth measurement delay time Tmd6. Accordingly, the elapsed time from the rising edge of the internal test clock signal iTCK till the trailing edge of the internal test read enable signal iTRE can be calculated by a sum of the first predetermined time Ta except the first measurement delay time Tmd1, the second predetermined time Tb, the third predetermined time Tc, the fourth predetermined time Td, the fifth predetermined time Te and the sixth measurement delay time Tmd6.

Furthermore, the calculation method of the difference between the delay times with respect to the trailing edge of the internal test clock signal iTCK and the trailing edge of the internal test write enable signal iTWE is described in detail. A delay time between trailing edges of signals with respect to the external output terminal 131 and the internal input terminal 111 corresponds with the clock trailing delay time Tck2 which indicates the delay time of the trailing edge of the internal test clock signal iTCLK against the trailing edge of the external test clock signal eTCK. Also, as described above, the delay time with respect to the trailing edge of the signal between the external input terminal 132 and the internal input terminal 112 corresponds with the write enable trailing delay time Twe2. Accordingly, the time difference between the delay times with respect to the trailing edge of the internal test clock signal iTCK and the trailing edge of the internal test write enable signal iTWE may be expressed by a difference between the clock trailing delay time Tck2 and the write enable trailing delay time Twe2. However, the clock trailing delay time Tck2 and the write enable trailing delay time Twe2 may not be directly measured. Meanwhile, a delay time between the trailing edge of the internal test clock signal iTCK and the first rising edge of the delay time measurement signal Sdt approximately corresponds with a delay time between the trailing edge of the internal test write enable signal iTWE and the second rising edge of the delay time measurement signal Sdt. That is, a time difference between the second measurement delay time Tmd2 and the clock trailing delay time Tck2 approximately corresponds with a time difference between the fourth measurement delay time Tmd4 and the write enable trailing delay time Twe2. Therefore, a time difference between the clock trailing delay time Tck2 and the write enable trailing delay time Twe2 corresponds with a time difference between the second measurement delay time Tmd2 and the fourth measurement delay time Tmd4. Accordingly, the difference between the delay times with respect to the trailing edge of the internal test clock signal iTCK and the trailing edge of the internal test write enable signal iTWE is calculated by the second measurement delay time Tmd2 and the fourth measurement delay time Tmd4.

The calculation method of the difference between the delay times with respect to the trailing edge of the internal test clock signal iTCK and the trailing edge of the internal test read enable signal iTRE is described in detail. As described above, the delay time with respect to the trailing edge of the signal between the external input terminal 131 and the internal input terminal 111 corresponds with the clock trailing delay time Tck2. Also, as described above, the delay time with respect to the trailing edge of the signal between the external input terminal 133 and the internal input terminal 113 corresponds with the read enable trailing delay time Tre2. Accordingly, the time difference between the delay times with respect to the trailing edge of the internal test clock signal iTCK and the trailing edge of the internal test read enable signal iTRE may be expressed by a difference between the clock trailing delay time Tck2 and the read enable trailing delay time Tre2. However, the clock trailing delay time Tck2 and the read enable trailing delay time Tre2 may not be directly measured. Meanwhile, the delay time between the trailing edge of the internal test clock signal iTCK and the first rising edge of the delay time measurement signal Sdt approximately corresponds with a delay time between the trailing edge of the internal test read enable signal iTRE and the third rising edge of the delay time measurement signal Sdt. That is, the time difference between the second measurement delay time Tmd2 and the clock trailing delay time Tck2 approximately corresponds with a time difference between the sixth measurement delay time Tmd6 and the read enable trailing delay time Tre2. Therefore, a time difference between the clock trailing delay time Tck2 and the read enable trailing delay time Tre2 corresponds with a time difference between the second measurement delay time Tmd2 and the sixth measurement delay time Tmd6. Accordingly, the difference between the delay times with respect to the trailing edge of the internal test clock signal iTCK and the trailing edge of the internal test read enable signal iTRE is calculated by the second measurement delay time Tmd2 and the sixth measurement delay time Tmd6.

According to the first preferred embodiment, the semiconductor integrated circuit includes the delay time measurement terminal coupled to the internal input terminals of the CUT (for example, the memory circuit) and includes the delay time measurement circuit coupled to the CUT and the delay time measurement terminal. In the semiconductor integrated circuit, elapsed times are measured after the external test input signals are turned to the "H" level or the "L" level till the delay time measurement signal is turned to the "L" level or the "H" level. Therefore, the time difference between the delay times with respect to the different internal test input signals can be calculated based on the elapsed times. That is, the operational test can be executed only against the CUT without the needle pico-probe contacting the internal input terminals by hand. As a result, not only the time required in the operational test can be reduced, but also the operational test can be easily executed under the condition of high temperature.

Furthermore, according to the first preferred embodiment, the delay time measurement circuit is composed of the delay time measurement transistors that respectively have open drain electrodes. Therefore, different power supply voltages are not necessary in the delay time measurement circuit in contrast to a delay time measurement circuit that is composed of transistors that have source follower electrodes. That is, the time difference between the delay times with respect to the different internal test input signals can be measured with the delay time measurement circuit in a smaller area.

Figure 5:
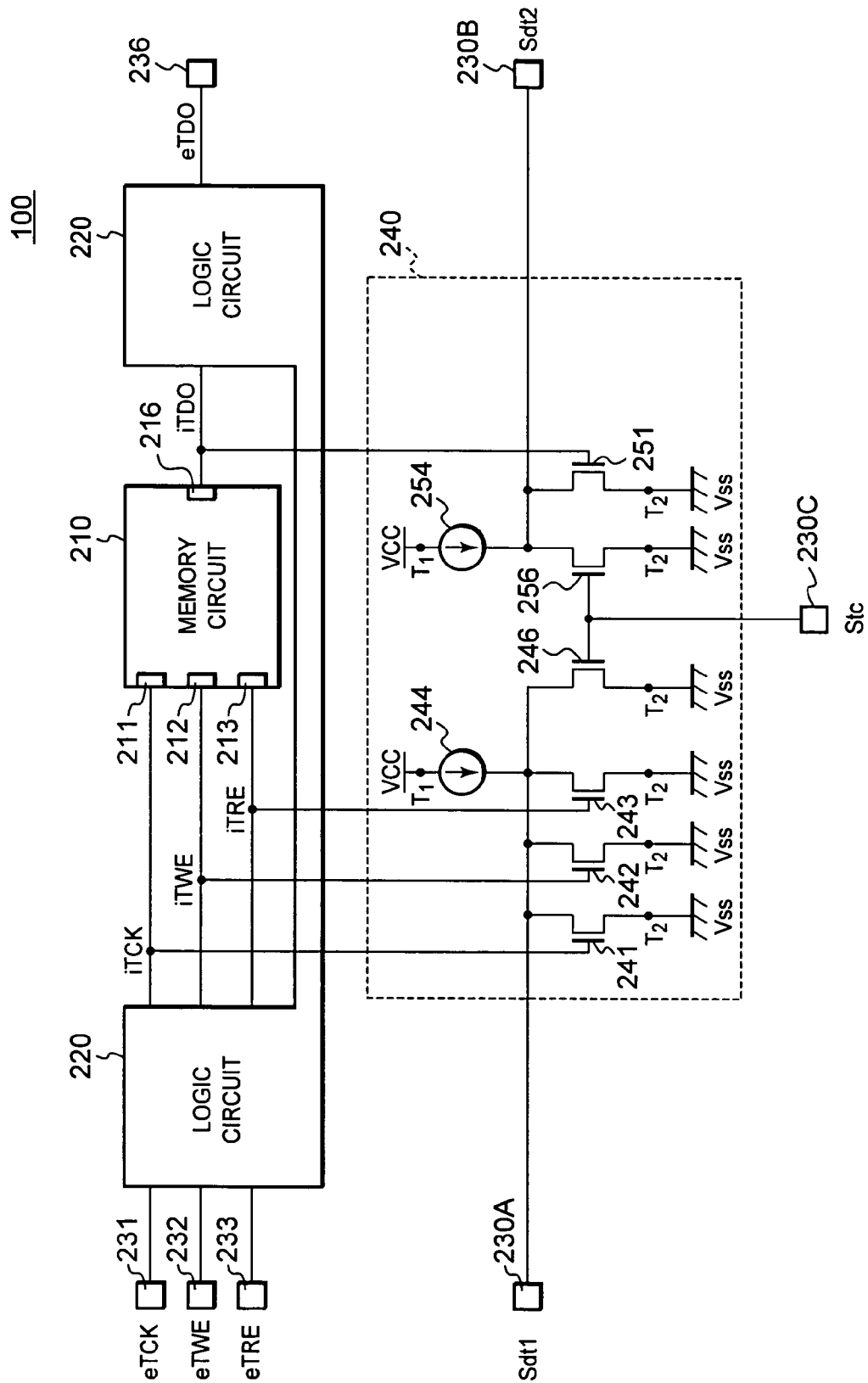
FIG. 5 is a schematic circuit diagram for describing a semiconductor integrated circuit according to a second preferred embodiment of the present invention.

FIG. 5 is a schematic circuit diagram for describing a semiconductor integrated circuit 200 according to a second preferred embodiment of the present invention. The semiconductor integrated circuit 200 measures an access time from inputting an internal clock signal to the memory circuit till outputting an internal data output signal from the memory circuit. The semiconductor integrated circuit 200 includes a memory circuit 210, a logic circuit 220, a plurality of external input terminals 231 through 233, an external output terminal 236, a delay time measurement circuit 240, a first and second delay time measurement terminals 230A and 230B, and a test control terminal 230C. In this example, the memory circuit 210 is the CUT.

The memory circuit 210 includes a plurality of internal input terminals 211 through 213 that respectively receive internal input signals and further includes an internal output terminal 216 that outputs an internal output signal. In this example, the internal input signals include an internal clock signal iCK, an internal write enable signal iWE and an internal read enable signal iRE. Also, the internal output signal includes an internal data output signal iDO.

The logic circuit 220 includes a peripheral circuit such as an input-output circuit with respect to the memory circuit 210. The logic circuit 220 provides the internal input signals for the memory circuit 210, based on a plurality of external input signals that have been input to the external input terminals 131 through 133. Also, the logic circuit 220 generates an external output signal as the data output signal, based on the internal data output signal iDO that have been output from the internal output terminal 216.

Hereupon, during the normal operational mode of the semiconductor integrated circuit 200, the external input signals include an external clock signal eCK, an external write enable signal eWE and an external read enable signal eRE, and the external output signal includes an external data output signal eDO. That is, the logic circuit 220 generates the internal clock signal iCK, the internal write enable signal iWE and the internal read enable signal iRE based on the external clock signal eCK, the external write enable signal eWE and the external read enable signal eRE for the internal input terminals 231 through 233 of the memory circuit 210, and outputs the external data output signal eDO based on the internal data output signal iDO.

On the other hand, during an operational test mode of the semiconductor integrated circuit 200, the logic circuit 220 receives a plurality of external input test signals and then provides them straight to the internal input terminals 231 through 233 of the memory circuit 210 as a plurality of internal input test signals, and further receives an internal output test signal and then provides it straight to the external output terminal 236 as an external output test signal. In this example, the external input test signals include an external test clock signal eTCK, an external test write enable signal eTWE and an external test read enable signal eTRE, and the internal input test signals include an internal test clock signal iTCK, an internal test write enable signal iTWE and an internal test read enable signal iTRE. Also, the external output test signal includes an external test data output signal eTDO, and the internal output test signal includes an internal test data output signal iTDO.

That is, the logic circuit 220 receives the external test clock signal eTCK, the external test write enable signal eTWE and the external test read enable signal eTRE and then provides them straight to the internal input terminals 231 through 233 of the memory circuit 210 as the internal test clock signal iTCK, the internal test write enable signal iTWE and the internal test read enable signal iTRE. Also, the logic circuit 220 receives the internal test data output signal iTDO and then provides it straight to the external output terminal 236 as the external test data output signal eTDO.

The delay time measurement circuit 240 detects the clock delay time CKDT, the write enable delay time WEDT and the read enable delay time REDT. The delay time measurement circuit 240 is coupled between the first electrical source terminal T1 and the second electrical source terminal T2 and includes a plurality of first delay time measurement NMOS transistors 241 through 243 and a first current generator 244. The first delay time measurement NMOS transistors 241 through 243 are coupled in parallel with one another between the first delay time measurement terminal 230A and the second electrical source terminal T2. The delay time measurement NMOS transistors 241 through 243 respectively have open drain electrodes and constitute a wired NOR circuit in order to pull up an electrical potential of the first delay time measurement terminal 230A as well as according to the first preferred embodiment. The current generator 244 is coupled between the first electrical source terminal T1 and the first delay time measurement terminal 230A. The first current generator 244 provides a first pull-up voltage to the first delay time measurement terminal 230A based on the power supply voltage Vcc. Also, the delay time measurement circuit 240 includes a first delay time approximation NMOS transistor 246 coupled between the first delay time measurement terminal 230A and the second electrical source terminal T2. The first delay time approximation NMOS transistor 246 includes a gate electrode coupled to the test control terminal 230C so as to receive a test control signal Stc. In addition, the first current generator 244 may be outside of the semiconductor integrated circuit 200. The electrical potential of the first delay time measurement terminal 230A is output from the first delay time measurement terminal 230A as a first delay time measurement signal Sdt1.

Furthermore, the delay time measurement circuit 240 includes a second delay time measurement NMOS transistor 251 and a second current generator 254. The second delay time measurement NMOS transistor 251 includes a source electrode coupled to the second electrical source terminal T2, a drain electrode coupled to the second delay time measurement terminal 230B, and a gate electrode coupled to the internal output terminal 216 of the memory circuit 210 so as to receive the internal test data output signal iTDO. The second current generator 254 is coupled between the first electrical source terminal T1 and the second delay time measurement terminal 230B. The second current generator 254 provides a second pull-up voltage to the second delay time measurement terminal 230B based on the power supply voltage Vcc. The second pull-up voltage may be different than the first pull-up voltage. Also, the delay time measurement circuit 240 includes a second delay time approximation NMOS transistor 256 coupled between the second delay time measurement terminal 230B and the second electrical source terminal T2. The second delay time approximation NMOS transistor 256 includes a gate electrode coupled to the test control terminal 230C so as to receive the test control signal Stc as well as the first delay time approximation NMOS transistor 246. In addition, the second current generator 254 may be outside of the semiconductor integrated circuit 200. The electrical potential of the second delay time measurement terminal 230B is output from the second delay time measurement terminal 230B as a second delay time measurement signal Sdt2.

Figure 6:
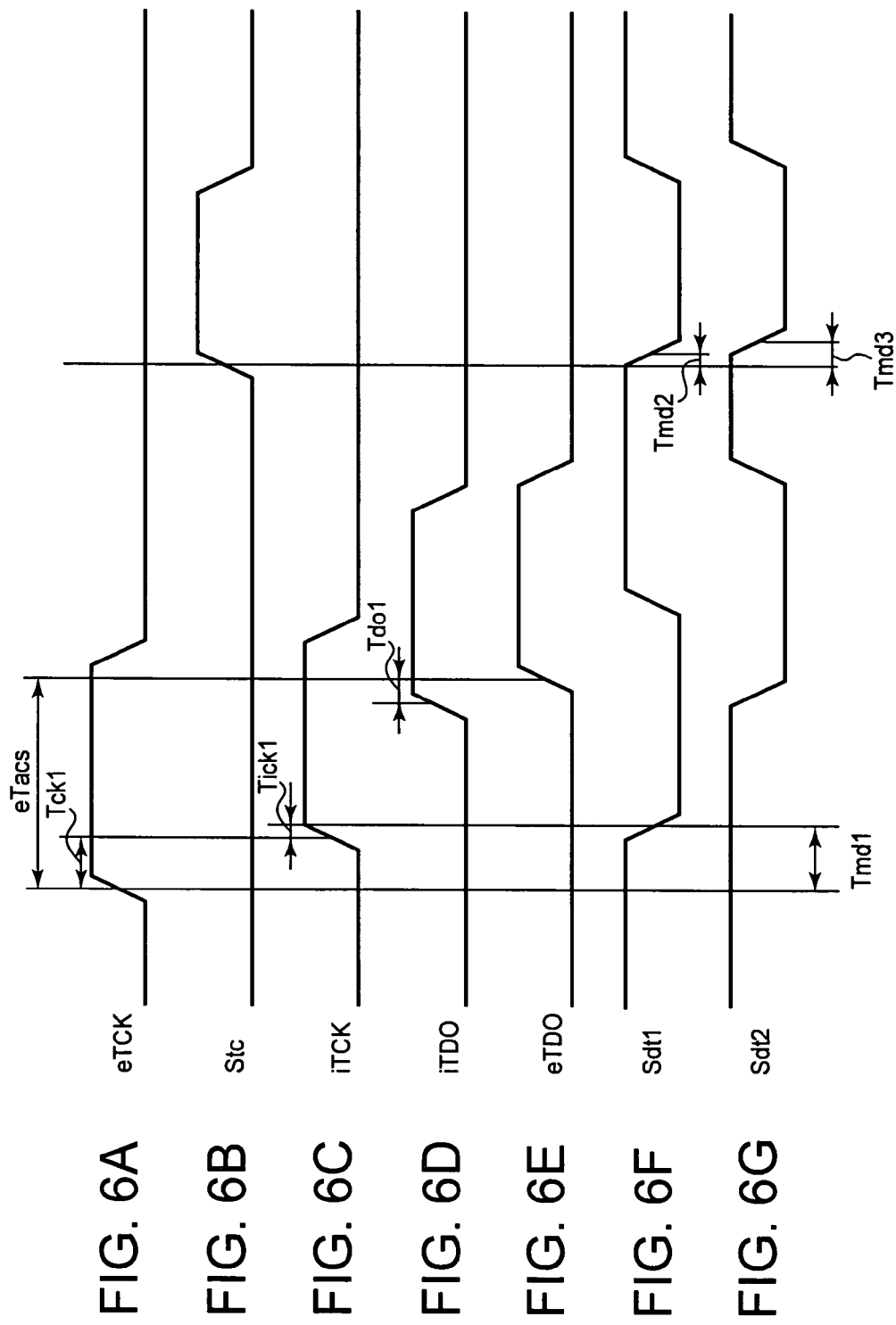
FIGS. 6A through 6G are signal waveform diagrams for describing the operation of the semiconductor integrated circuit in FIG. 5.

The operation of the semiconductor integrated circuit 200 according to the second preferred embodiment of the present invention is described below. FIGS. 6A through 6G are signal waveform diagrams for describing the operation of the semiconductor integrated circuit 200 in FIG. 5. FIG. 6A represents a waveform of the external test clock signal eTCK, FIG. 6B represents a waveform of the test control signal Stc, FIG. 6C represents a waveform of the internal test clock signal iTCK, FIG. 6D represents a waveform of the internal test data output signal iTDO, FIG. 6E represents a waveform of the external test data output signal iTDO, FIG. 6F represents a waveform of the first delay time measurement signal Sdt1, and FIG. 6G represents a waveform of the second delay time measurement signal Sdt2.

First of all, when electrical potentials of the external input terminals 231 through 233 and the test control terminal 230C, that is, the external test clock signal eTCK, the external test write enable signal eTWE, the external test read enable signal eTRE and the test control signal Stc are kept at the "L" level, the internal test data output signal iTDO is kept at the "L" level. Therefore, all of the first and second delay time measuring NMOS transistors 241 through 243 and 251 and the first and second delay time approximation NMOS transistor 246 and 256 are turned OFF. Thus, electrical potentials of the first and second delay time measurement terminals 230A and 230B, that is, the first and second delay time measurement signals Sdt1 and Sdt2 are kept at the "H" level by the first and second current generators 244 and 254.

Next, the external test clock signal eTCK is turned to the "H" level while the external test write enable signal eTWE and the external test read enable signal eTRE are kept at the "L" level as shown in FIG. 6A. Then, the internal test clock signal iTCK is turned to the "H" level behind the rising edge of the external test clock signal eTCK by a clock rising delay time Tck1 as shown in FIG. 6C. Therefore, the clock delay time measurement NMOS transistor 241 is turned ON, and then the electrical potential of the first delay time measurement terminal 230A is turned to the "L" level as shown in FIG. 6F. That is, the first delay time measurement signal Sdt1 is turned to the "L" level behind the rising edge of the external test clock signal eTCK by a first measurement delay time Tmd1 as shown in FIG. 6F. The first measurement delay time Tmd1 can be measured in accordance with the rising edge of the external test clock signal eTCK and the trailing edge of the first delay time measurement signal Sdt1. Also, an elapsed time between the rising time of the internal clock signal iTCK and the trailing edge of the first delay time measurement signal Sdt1 is defined as an internal clock rising delay time Tick1.

When the internal test clock signal iTCK is turned to the "H" level, an electrical potential of the internal output terminal 216, that is, the internal data output signal iTDO is turned to the "H" level. Therefore, the external test data output signal eTDO is turned to the "H" level behind the rising edge of the internal data output signal iTDO by a data output rising delay time Tdo1 as shown in FIG. 6E. The data output rising delay time Tdo1 indicates a delay time between rising edges of signals with respect to the external output terminal 236 and the internal output terminal 216. Hereupon, an external access time eTacs can be measured in accordance with the rising edge of the external test clock signal eTCK and the rising edge of the external data output signal eTDO.

Then, the external test clock signal eTCK is turned to the "L" level after the rising edge of the external data output signal eTDO. Thus, the internal test clock signal iTCK is turned to the "L" level. As a result, the internal data output signal iTDO is turned to the "L" level and then the external data output signal eTDO is also turned to the "L" level. At this moment, since all of the internal test clock signal iTCK, the internal test write enable signal iTWE, the internal test read enable signal iTRE, the internal test data output signal iTDO and the test control signal Stc are kept at the "L" level. Therefore, all of the first and second delay time measuring NMOS transistors 241 through 243 and 251 and the first and second delay time approximation NMOS transistors 246 and 256 are turned OFF. Thus, the first and second delay time measurement signals Sdt1 and Sdt2 that are output from the first and second delay time measurement terminals 230A and 230B are respectively turned to the first and second pull-up voltages by the first and second current generators 244 and 254 as shown in FIGS. 6F and 6G.

After the rising edges of the first and second delay time measurement signals Sdt1 and Sdt2, the test control signal Stc is turned to the "H" level while the external test clock signal eTCK, the external test write enable signal eTWE and the external test read enable signal eTRE are kept at the "L" level as shown in FIG. 6B. Therefore, the first and second delay time approximation NMOS transistor 246 and 256 are turned ON, and then the first and second delay time measurement signals Sdt1 and Sdt2 are turned to the "L" level. Hereupon, two delay times can be measured on the first and second delay time measurement terminals 230A and 230B. Thai is, the delay time between the rising edge of the test control signal Stc and the trailing edge of the first delay time measurement signal Sdt1 can be measured as a second measurement delay time Tmd2 and the other delay time between the rising edge of the test control signal Stc and the trailing edge of the second delay time measurement signal Sdt2 can be measured as a third measurement delay time Tmd3.

The calculation method of the access time from inputting the internal test clock signal iTCK to the memory circuit 210 till outputting the internal data output signal iTDO from the memory circuit 210 is described below.

The second measurement delay time Tmd2 is an elapsed time from turning the test control signal Stc to the "H" level till turning the first delay time measurement signal Sdt1 to the "L" level. Meanwhile, the internal clock rising delay time Tick1 is an elapsed time from inputting the internal clock signal iTCK of the "H" level to the gate electrode of the first delay time measuring NMOS transistor 241 till turning the first delay time measurement signal Sdt1 to the "L" level. Hereupon, the first delay time measuring NMOS transistor 241 has the same volt-ampere characteristic as the first delay time approximation NMOS transistor 246. Alternatively, a ratio of a gate width to a gate length of the first delay time measuring NMOS transistor 241 is greater than a ration of a gate width to a gate length of the first delay time approximation NMOS transistor 246. Accordingly, the second measurement delay time Tmd2 approximately corresponds with the internal clock rising delay time Tick1 between the rising time of the internal clock signal iTCK and the trailing edge of the first delay time measurement signal Sdt1 as seen in FIGS. 6C and 6F. Therefore, the clock rising delay time Tck1, that indicates a delay time between rising edges of signals with respect to the external input terminal 231 and the internal input terminal 211, approximately corresponds with a difference between The first measurement delay time Tmd1 and the second measurement delay time Tmd2. That is, the clock rising delay time Tck1 can be obtained by a difference between the first measurement delay time Tmd1 and the second measurement delay time Tmd2.

On the other hand, the second delay time measuring NMOS transistor 251 is designed so that the data output rising delay time Tdo1 can be equal to an elapsed time from turning the internal test data output signal iTDO to the "H" level till turning the second delay time measurement signal Sdt2 to the "L" level. For example, the second delay time approximation NMOS transistor 256 has the same volt-ampere characteristic as the second delay time measuring NMOS transistor 251. Alternatively, a ratio of a gate width to a gate length of the second delay time measuring NMOS transistor 251 is greater than a gate width of a gate length of the second delay time approximation NMOS transistor 256. That is, the third measurement delay time Tmd3 that indicates the elapsed time from turning the test control signal Stc to the "H" level till turning the second delay time measurement signal Sdt2 to the "L" level is equal to the elapsed time from turning the internal test data output signal iTDO to the "H" level till turning the second delay time measurement signal Sdt2 to the "L" level. Accordingly, the third measurement delay time Tmd3 approximately corresponds with the data output rising delay time Tdo1.

As described above, the access time of the memory circuit 210 is an elapsed time from inputting the internal test clock signal iTCK to the memory circuit 210 till outputting the internal data output signal iTDO from the memory circuit 210. As seen from FIGS. 6A and 6C through 6E, the access time of the memory circuit 210 is calculated by the external access time eTacs except the clock rising delay time Tck1 and the data output rising delay time Tdo1. Hereupon, as described above, the clock rising delay time Tck1 is approximately equal to the difference between the first measurement delay time Tmd1 and the second measurement delay time Tmd2, and the data output rising delay time Tdo1 is approximately equal to the third measurement delay time Tmd3. Accordingly, the access time of the memory circuit 210 can be obtained by a sum of the external access time eTacs and the second measurement delay time Tmd2 except the first and third measurement delay times Tmd1 and Tmd3.

According to the second preferred embodiment, the semiconductor integrated circuit includes the first delay time measurement terminal coupled to the internal input terminals of the CUT (for example, the memory circuit) and the second delay time measurement terminal coupled to the internal output terminal of the CUT. The semiconductor integrated circuit further includes the delay time measurement circuit coupled to the CUT and the first and second delay time measurement terminals. Also, the delay time measurement circuit includes the first and second delay time approximation transistors in order to measure the clock rising delay time and the data output rising delay time. In the above-mentioned semiconductor integrated circuit, the elapsed time from inputting the internal test clock signal to the CUT till outputting the internal data output signal from the CUT is measured through the first and second delay time measurement terminals. That is, the access time with respect to the CUT can be properly measured. Furthermore, in the above-mentioned semiconductor integrated circuit, the operational test can be executed only against the CUT without the needle pico-probe contacting the internal input and output terminals by hand. As a result, not only can the time required in the operational test be reduced, but also the operational test can be easily executed under the condition of high temperature.

In addition, according to the second preferred embodiment, elapsed times can be directly measured from turning the internal test clock signal, the internal test write enable signal, the internal test read enable signal and the internal test data output signal to the "H" level or the "L" level till turning the first and second delay time measurement signals to the "L" level or the "H" level. Therefore, the delay time between the external input signal and the internal input signal and the delay time between the internal output signal and the external output signal can be easily measured.

Figure 7:
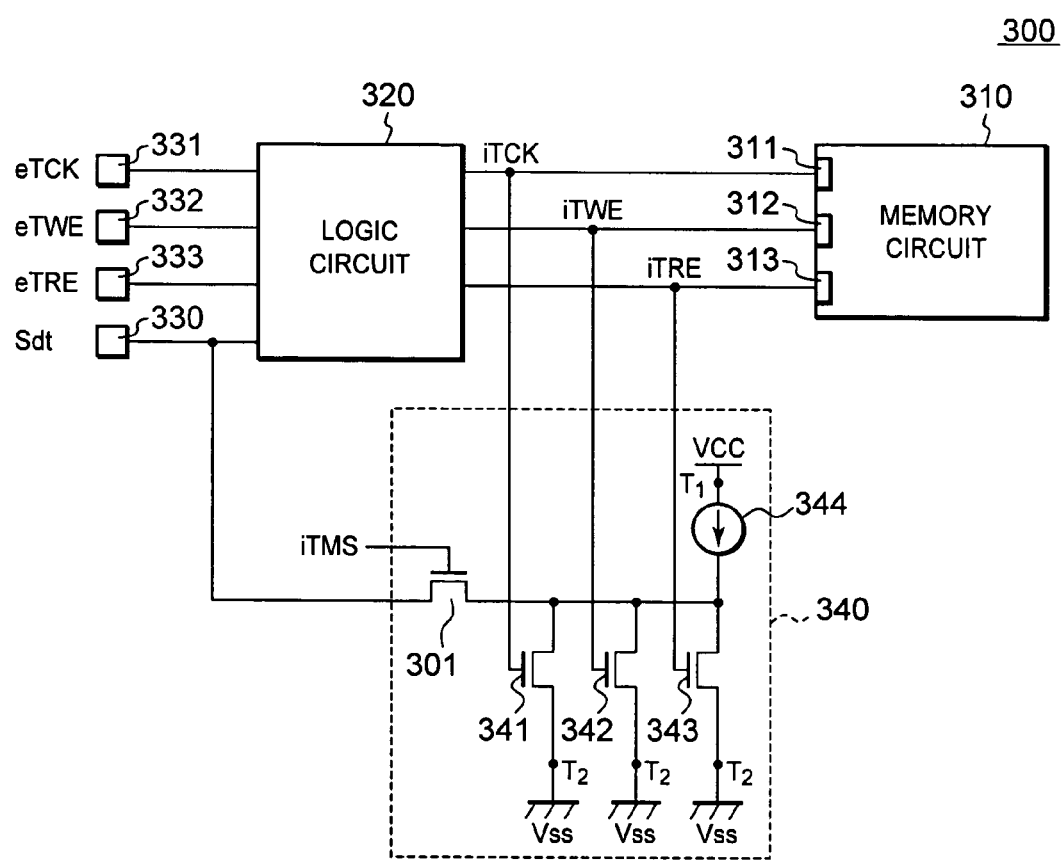
FIG. 7 is a schematic circuit diagram for describing a semiconductor integrated circuit according to a third preferred embodiment of the present invention.

FIG. 7 is a schematic circuit diagram for describing a semiconductor integrated circuit 300 according to a third preferred embodiment of the present invention. The semiconductor integrated circuit 300 includes a memory circuit 310, a logic circuit 320, a plurality of external input terminals 331 through 333, a delay time measurement circuit 340 and a delay time measurement terminal 330. In this example, the memory circuit 310 is the CUT.

The memory circuit 310 includes a plurality of internal input terminals 311 through 313 as well as the internal input terminals 111 thorugh 113 of the memory circuit 110 according to the first preferred embodiment.

The logic circuit 320 is coupled between the external input terminals 331 through 333 and the internal input terminals 311 though 313 so as to generate internal input test signals based on external input test signals. The external input test signals include the external test clock signal eTCK, the external test write enable signal eTWE and the external test read enable signal eTRE, and the internal input test signals include the internal test clock signal iTCK, the internal test write enable signal iTWE and the internal test read enable signal iTRE.

The delay time measurement circuit 340 is coupled between the first electrical source terminal T1 and the second electrical source terminal T2 and includes a plurality of delay time measurement NMOS transistors 341 through 343 and a current generator 344. The delay time measurement NMOS transistors 141 through 143 are coupled between the delay time measurement terminal 330 and the second electrical source terminal T2 and respectively controlled by the internal test clock signal iTCK, the internal test write enable signal iTWE and the internal test read enable signal iTRE. The current generator 344 is coupled between the first electrical source terminal T1 and the delay time measurement terminal 330. The current generator 344 provides a pull-up voltage to the delay time measurement terminal 330 based on the power supply voltage Vcc. The current generator 344 may be outside of the semiconductor integrated circuit 200. The delay time measurement circuit 340 further includes a switching NMOS transistor 301 coupled between the delay time measurement terminal 330 and the current generator 344. The switching NMOS transistor 301 is also coupled to the delay time measurement NMOS transistors 141 through 143. The switching NMOS transistor 301 includes a gate electrode that receives a test mode select signal TMS. The test mode select signal TMS switches the semiconductor integrated circuit 300 into the normal operational mode or the operational test mode. The test mode select signal TMS may be generated from the logic circuit 320 or may be generated externally. Furthermore, the delay time measurement terminal 330 is coupled not only to the delay time measurement circuit 340 but also to the logic circuit 320. That is, the delay time measurement terminal 330 is used as an input-output terminal during the normal operational mode of the semiconductor integrated circuit 300. Also, the delay time measurement terminal 330 output the electrical potential of the delay time measurement terminal 330 as a delay time measurement signal Sdt during the operational test mode of the semiconductor integrated circuit 300.

Figure 8:
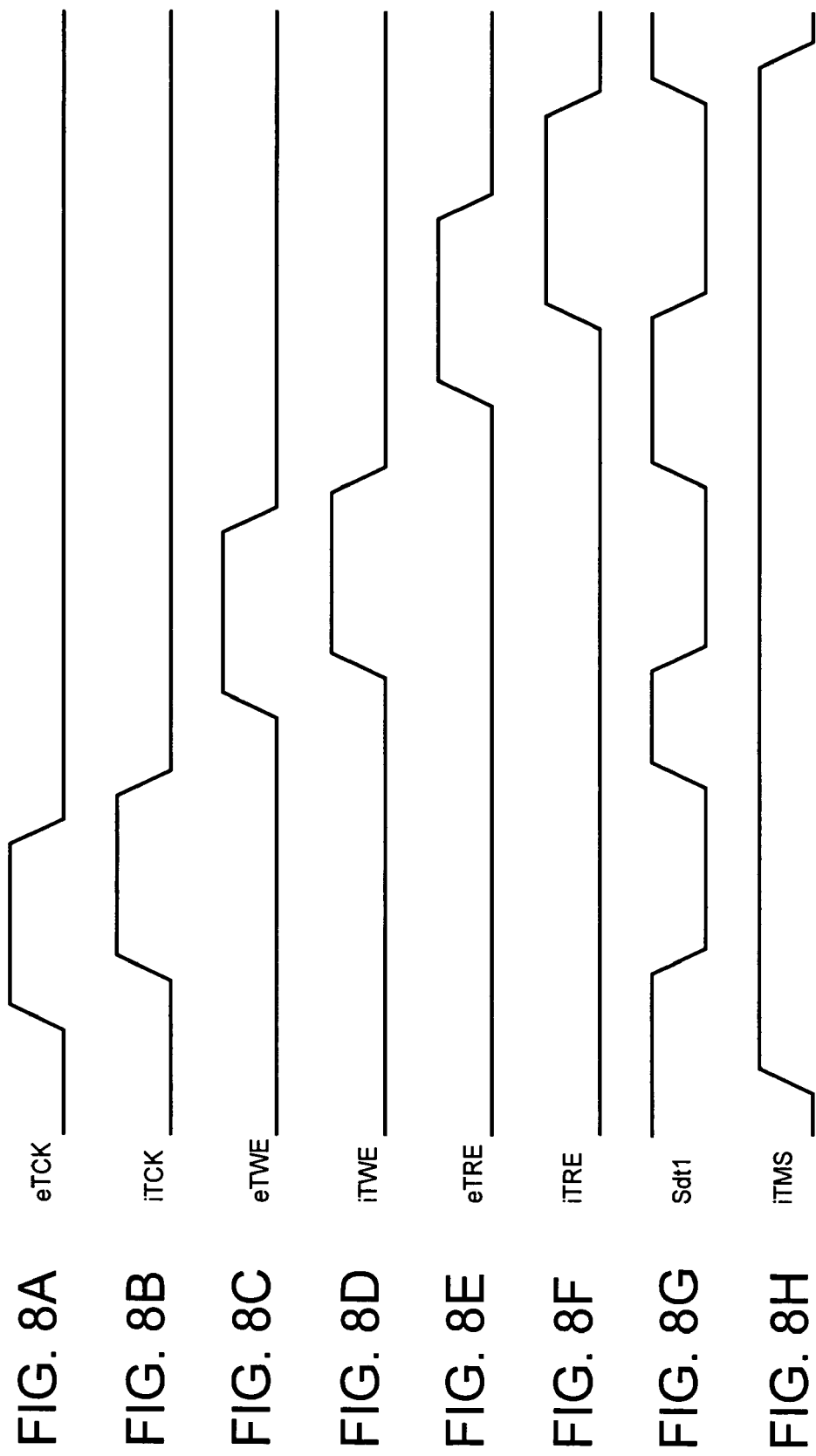
FIGS. 8A through 8H are signal waveform diagrams for describing the operation of the semiconductor integrated circuit in FIG. 7.

The operation of the semiconductor integrated circuit 300 according to the third preferred embodiment of the present invention is described below. FIGS. 8A through 8H are signal waveform diagrams for describing the operation of the semiconductor integrated circuit 300 in FIG. 7. FIG. 8A represents a waveform of the external test clock signal eTCK, FIG. 8B represents a waveform of the internal test clock signal iTCK, FIG. 8C represents a waveform of the external test write enable signal TWE, FIG. 8D represents a waveform of the internal test write enable signal iTWE, FIG. 8E represents a waveform of the external test read enable signal TRE, FIG. 8F represents a waveform of the internal test read enable signal iTRE, FIG. 8G represents a waveform of the delay time measurement signal Sdt, and FIG. 8H represents a waveform of the test mode select signal TMS.

During the operational test mode, the test mode select signal TMS is turned to the "H" level as shown in FIG. 8H. Thus, the switching NMOS transistor 301 is turned ON, and then the delay time measurement NMOS transistors 141 through 143 are electrically coupled to the delay time measurement terminal 330. As a result, the measurements of the delay times of the internal test clock signal iTCK, the internal test write enable signal iTWE and the internal test read enable signal iTRE can be executed and then the time difference between the delay times with respect to the different internal test signals can be obtained as well as according to the first preferred embodiment. After the operational test is completed, the test mode select signal TMS is turned to the "L" level.

According to the third preferred embodiment, the same effects can be realized as well as according to the first preferred embodiment. Furthermore, according to the third preferred embodiment, the delay time measurement terminal, from which the delay time measurement signal is output during the operational test mode, is used as the input-output terminal during the normal operational mode. Therefore, the increase of the number of the external input terminals disposed in the semiconductor integrated circuit can be suppressed. As a result, the increase of the area of the semiconductor integrated circuit can be suppressed.

Figure 9:
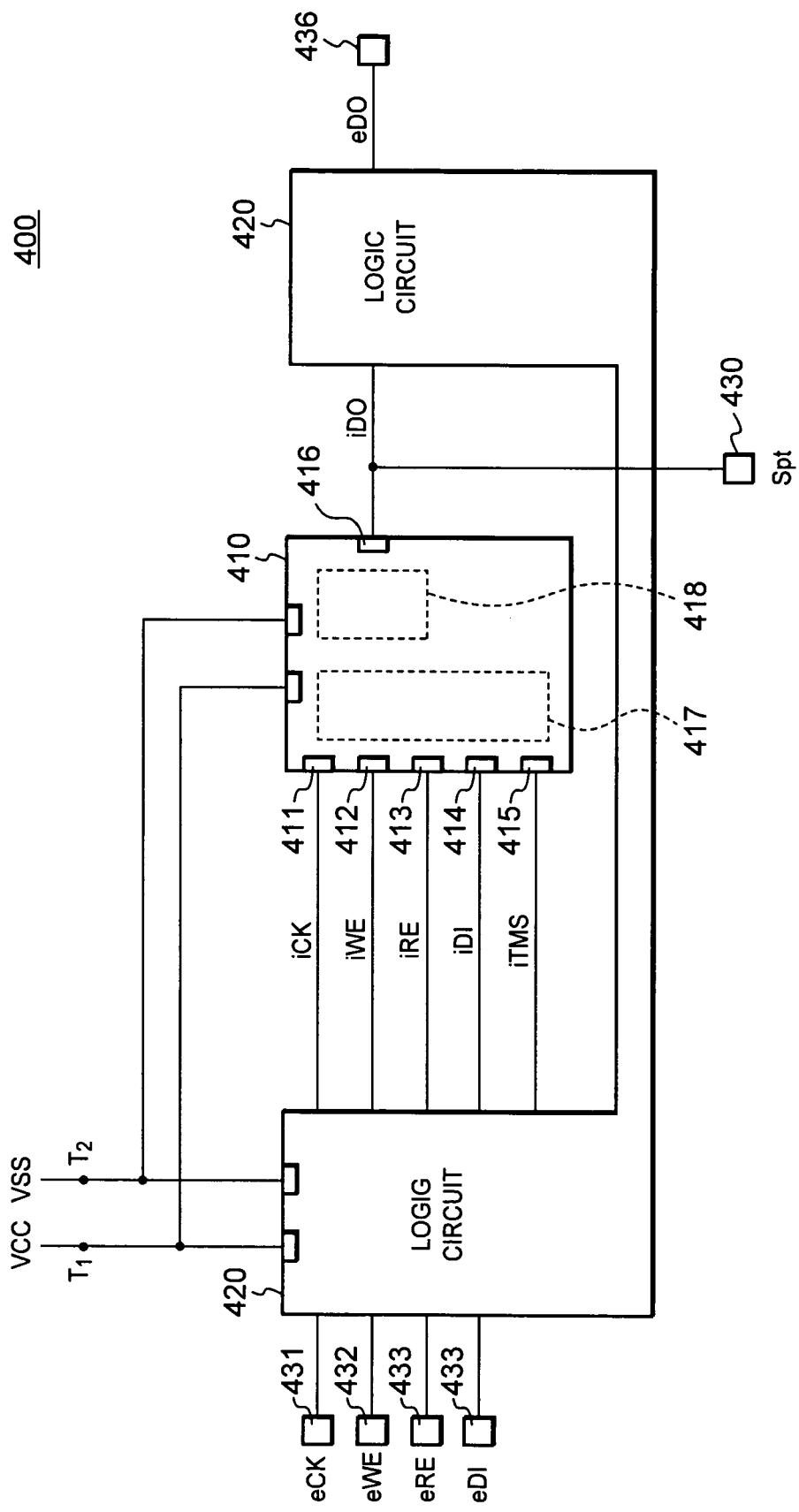
FIG. 9 is a schematic circuit diagram for describing a semiconductor integrated circuit according to a fourth preferred embodiment of the present invention.

FIG. 9 is a schematic circuit diagram for describing a semiconductor integrated circuit 400 according to a fourth preferred embodiment of the present invention. The semiconductor integrated circuit 400 measures consumption current in the memory circuit. The semiconductor integrated circuit 400 includes a memory circuit 410, a logic circuit 420, a plurality of external input terminals 431 through 434, an external output terminal 436, and a pseudo test terminal 430. In this example, the memory circuit 410 is the CUT.

The memory circuit 410, that is coupled to the first electrical source terminal T1 and the second electrical source terminal T2, includes a plurality of internal input terminals 411 through 415 that respectively receive internal input signals and further includes an internal output terminal 416 that outputs an internal output signal. In this example, the internal input signals include an internal clock signal iCK, an internal write enable signal iWE, an internal read enable signal iRE, an internal data input signal iDI, and an internal test mode select signal iTMS. The internal output signal includes an internal data output signal iDO. The memory circuit 410 also includes an input switching circuit 417 and an output switching circuit 418. The internal output terminal 416 of the memory circuit 410 is coupled to the pseudo test terminal 430 into which a pseudo test signal Spt is input.

The logic circuit 420 is coupled between the memory circuit 410 and the external input terminals 431 through 434 and is coupled to the first electrical source terminal T1 and the second electrical source terminal T2. The logic circuit 420 generates the internal input signals based on a plurality of external input signals. The external input signals include an external clock signal eCK, an external write enable signal eWE, an external read enable signal eRE, and an external data input signal eDI. That is, the logic circuit 420 generates the internal clock signal iCK, the internal write enable signal iWE, the internal read enable signal iRE, and the internal data input signal iDI for the internal input terminals 411 through 415 of the memory circuit 410, based on the external clock signal eCK, the external write enable signal eWE, the external read enable signal eRE, and the external data input signal eDI. Also, the logic circuit 420 generates an external output signal based on the internal output signal. The external output signal includes an external data output signal eDO. That is, the logic circuit 420 generates the external data output signal eDO based on the internal data output signal iDO. The external data output signal eDO is output from the external output terminal 436. In addition, the logic circuit 420 turns the internal test mode select signal iTMS to the "L" level when consumption current in the whole semiconductor integrated circuit 400 is measured, and turns the internal test mode select signal iTMS to the "H" level when consumption current only in the logic circuit 420 is measured.

Figure 10A:
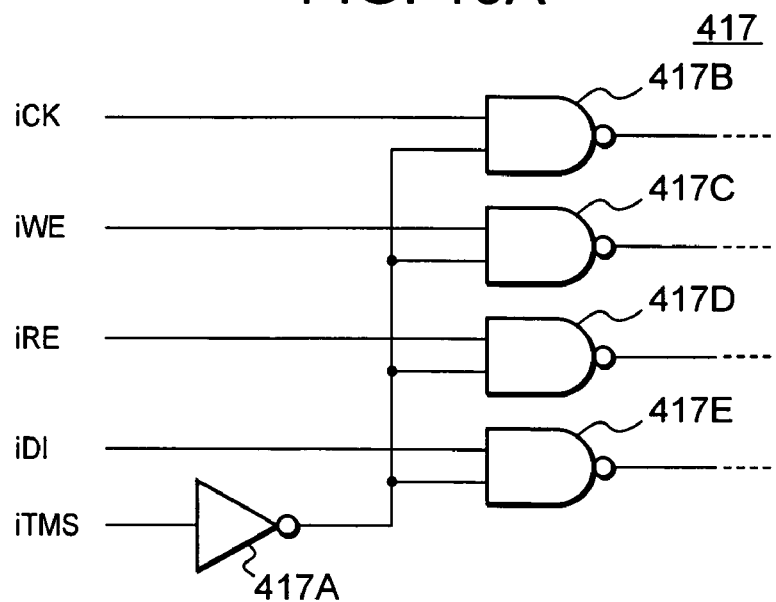
FIGS. 10A and 10B are schematic circuit diagrams for describing the input switching circuit and the output switching circuit of the memory circuit in the semiconductor integrated circuit in FIG. 9.
Figure 10B:
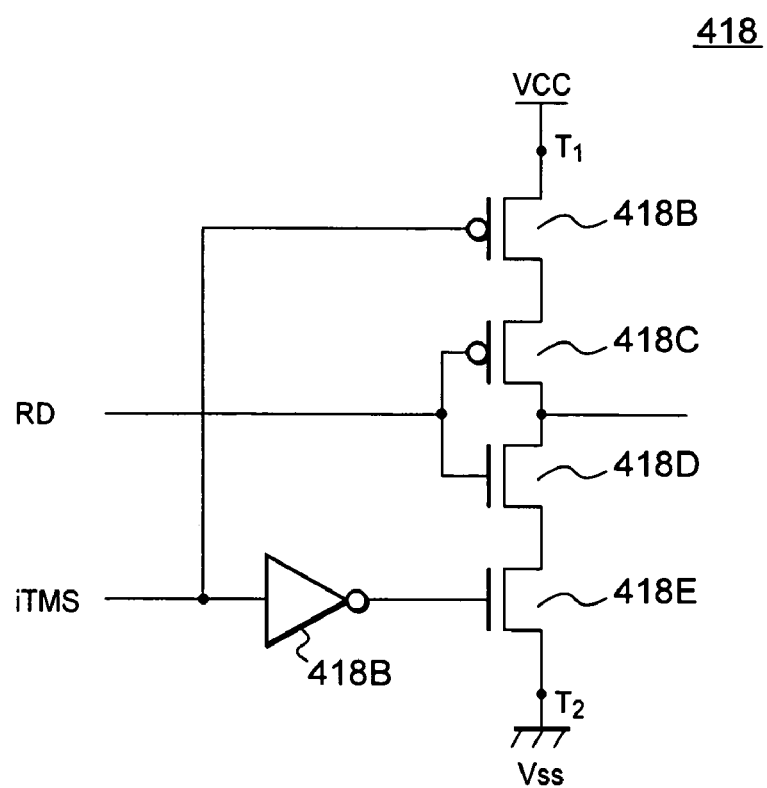

FIGS. 10A and 10B are schematic circuit diagrams for describing the input switching circuit 417 and the output switching circuit 418 of the memory circuit 410 in the semiconductor integrated circuit 400 in FIG. 9.

As shown in FIG. 10A, the input switching circuit 417 includes an inverter 417A and four NAND circuits 417B through 417E. The inverter 417A includes an input node coupled to the internal input terminal 415 and an output node coupled to the NAND circuits 417B through 417E. The NAND circuits 417B through 417E respectively have output nodes coupled to an internal circuit of the memory circuit 410. The inverter 417A receives the internal test mode select signal iTMS and then provides an inverted internal test mode select signal iTMSb for the NAND circuits 417B through 417E. The NAND circuit 417B includes an input node coupled to the internal input terminal 411 to receive the internal clock signal iCK. The NAND circuit 417B outputs an inverted internal clock signal iCKb when the inverted internal test mode select signal iTMSb is turned to the "H" level. Also, an output node of the NAND circuit 417B is kept to have high impedance when the inverted internal test mode select signal iTMSb is turned to the "L" level. The NAND circuit 417C includes an input node coupled to the internal input terminal 412 to receive the internal write enable signal iWE. The NAND circuit 417C outputs an inverted internal write enable signal iWEb when the inverted internal test mode select signal iTMSb is turned to the "H" level. Also, an output node of the NAND circuit 417C is kept to have the high impedance when the inverted internal test mode select signal iTMSb is turned to the "L" level. The NAND circuit 417D includes an input node coupled to the internal input terminal 413 to receive the internal read enable signal iRE. The NAND circuit 417D outputs an inverted internal read enable signal iREb when the inverted internal test mode select signal iTMSb is turned to the "H" level. Also, an output node of the NAND circuit 417D is kept to have the high impedance when the inverted internal test mode select signal iTMSb is turned to the "L" level. The NAND circuit 417E includes an input node coupled to the internal input terminal 414 to receive the internal data input signal iDI. The NAND circuit 417E outputs an inverted internal data input signal iDIb when the inverted internal test mode select signal iTMSb is turned to the "H" level. Also, an output node of the NAND circuit 417E is kept to have the high impedance when the inverted internal test mode select signal iTMSb is turned to the "L" level. As described above, the input switching circuit 417 inverts levels of the internal clock signal iCK, the internal write enable signal iWE, the internal read enable signal iRE and the internal data input signal iDI when the internal test mode select signal iTMS is turned to the "L" level. On the other hand, when the internal test mode select signal iTMS is turned to the "H" level, the output nodes of the input switching circuit 417 are kept to have the high impedance.

As shown in FIG. 10B, the output switching circuit 418 includes an inverter 418A, two PMOS transistors 418B and 418C, and two NMOS transistors 418D and 418E. The inverter 418A includes an input node coupled to the internal input terminal 415 in order to invert the internal test mode select signal iTMS and then output an inverted internal test mode select signal iTMSb. The PMOS transistor 418B includes a source electrode coupled to the first electrical source terminal T1 and a gate electrode coupled to the internal input terminal 415 so as to receive the internal test mode select signal iTMS. The PMOS transistor 418C includes a source electrode coupled to a drain electrode of the PMOS transistor 418B, a drain electrode coupled to the internal output terminal 416 from which the internal data output signal iDO is output, and a gate electrode coupled to the internal circuit of the memory circuit 410 so as to receive a readout data RD from the memory circuit 410. The NMOS transistor 418D includes a drain electrode coupled to the internal output terminal 416 and a gate electrode coupled to the internal circuit of the memory circuit 410 so as to receive a readout data RD from the memory circuit 410. The NMOS transistor 418E includes a source electrode coupled to the second electrical source terminal T2, a drain electrode coupled to a source electrode of the NMOS transistor 418D, and a gate electrode coupled to an output node of the inverter 418A so as to receive the inverted internal test mode select signal iTMSb. As described above, the output switching circuit 418 inverts a level of the readout data RD from the memory circuit 410, when the internal test mode select signal iTMS is turned to the "L" level. On the other hand, when the internal test mode select signal iTMS is turned to the "H" level, the internal output terminal 416 is kept to have the high impedance.

The operation of the semiconductor integrated circuit 400 according to the fourth preferred embodiment of the present invention is described below. Before the consumption current in the memory circuit 410 is measured, the internal test mode select signal iTMS is turned to the "L" level by the logic circuit 420. On such an occasion as this, the input switching circuit 417 allows the inverted internal clock signal iCKb, the inverted internal write enable signal iWEb, the inverted internal read enable signal iREb and the inverted internal data input signal iDIb to be input to the internal of the memory circuit 410, and the output switching circuit 418 allows the internal data output signal iDO to be output from the memory circuit 410.

Then, the external clock signal eCK, the external write enable signal eWE, the external read enable signal eRE, and the external data input signal eDI, that are to be used when the semiconductor integrated circuit 400 operates in the normal operational mode, are input to the external input terminals 431 through 434. At this point, the pseudo test terminal 430 is kept in a floating state. Accordingly, the logic circuit 420 generates the internal clock signal iCK, the internal write enable signal iWE, the internal read enable signal iRE and the internal data input signal iDI for the memory circuit 410 based on the external clock signal eCK, the external write enable signal eWE, the external read enable signal eRE, and the external data input signal eDI, and the memory circuit 410 generates the internal data output signal iDO for the logic circuit 420 based on the internal clock signal iCK, the internal write enable signal iWE, the internal read enable signal iRE and the internal data input signal iDI. Furthermore, the logic circuit 420 generates the external data output signal eDO based on the internal data output signal iDO. As described above, the both the memory circuit 410 and the logic circuit 420 operate normally. Therefore, when the internal test mode select signal iTMS is turned to the "L" level, the consumption current Iccn in the semiconductor integrated circuit 400 is equal to a sum of the consumption current I1 in the memory circuit 410 and the consumption current I2 in the logic circuit 420.

Next, the internal test mode select signal iTMS is turned to the "H" level by the logic circuit 420. On such an occasion as this, the output nodes of the input switching circuit 417 and the internal output terminal 416 of the memory circuit 410 are kept to have the high impedances.

Then, the external clock signal eCK, the external write enable signal eWE, the external read enable signal eRE, and the external data input signal eDI, that are to be used when the semiconductor integrated circuit 400 operates in the normal operational mode, are input to the external input terminals 431 through 434. In this instance, the logic circuit 420 generates the internal clock signal iCK, the internal write enable signal iWE, the internal read enable signal iRE and the internal data input signal iDI for the memory circuit 410 based on the external clock signal eCK, the external write enable signal eWE, the external read enable signal eRE, and the external data input signal eDI. Also, when the internal test mode select signal iTMS is kept at the "H" level, the internal output terminal 416 of the memory circuit 410 is kept to have the high impedance by the output switching circuit 418 and the pseudo test signal Spt is input to the pseudo test terminal 430. Therefore, the logic circuit 420 generates the external data output signal eDO based on the pseudo test signal Spt. Meanwhile, since the output nodes of the input switching circuit 417 are kept to have the high impedances, the memory circuit 410 is in a non-action mode. That is, when the internal test mode select signal iTMS is turned to the "H" level, the logic circuit 420 operates normally and the memory circuit 410 is in the non-action mode. Therefore, the consumption current Ict in the semiconductor integrated circuit 400 is equal to the consumption current I2 in the logic circuit 420, when the internal test mode select signal iTMS is turned to the "H" level. As a result, the consumption current I1 in the memory circuit 410 can be obtained by a difference between the consumption current Iccn and the consumption current Icct.

According to the fourth preferred embodiment, the semiconductor integrated circuit 400 includes the input switching circuit and the output switching circuit in the CUT (for example, the memory circuit) and further includes the pseudo test terminal in order to generate the external data output signal based on the pseudo test signal when the CUT is in the non-action mode. Therefore, the consumption current in the CUT can be easily and exactly measured.

Figure 11:
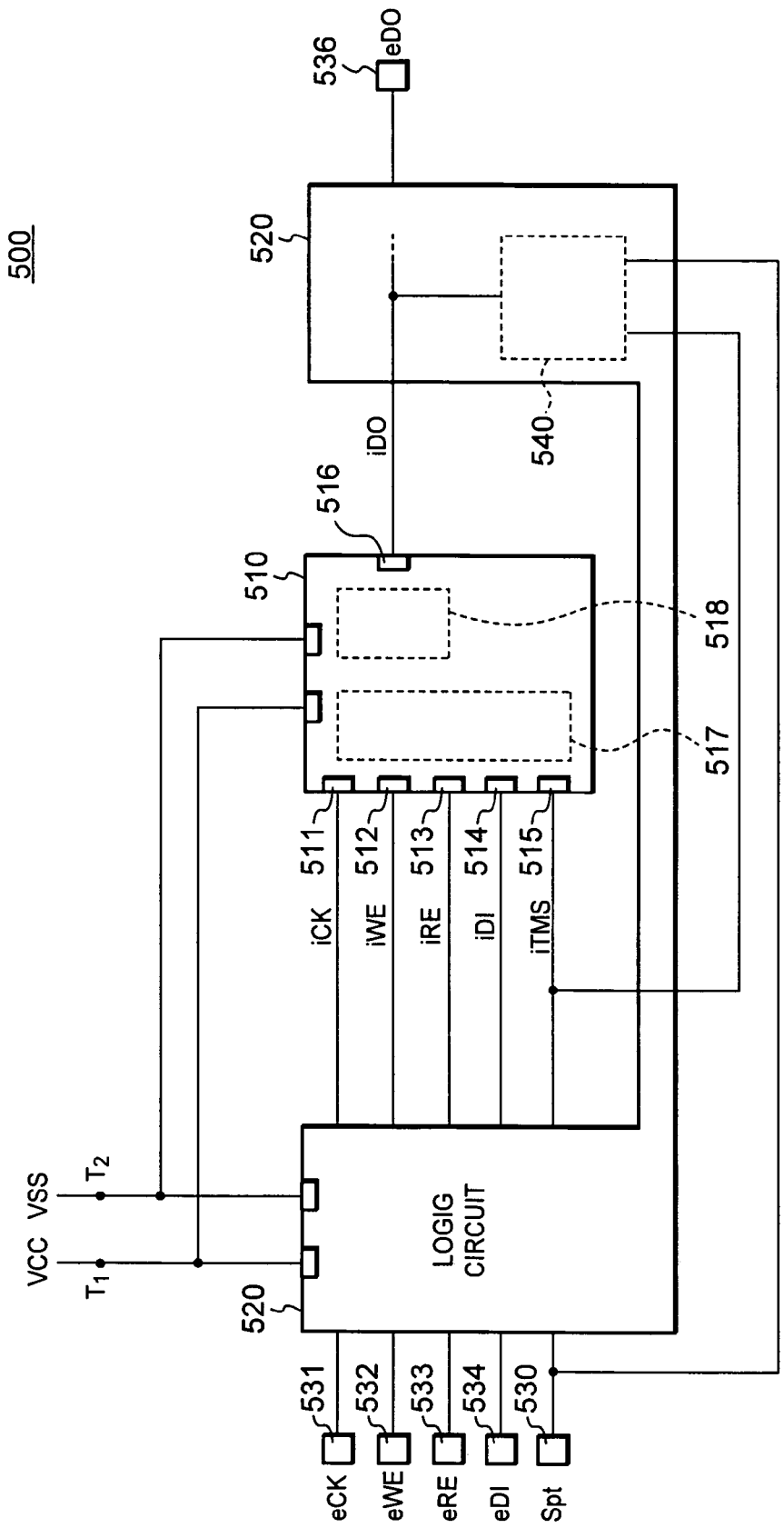
FIG. 11 is a schematic circuit diagram for describing a semiconductor integrated circuit according to a fifth preferred embodiment of the present invention.

FIG. 11 is a schematic circuit diagram for describing a semiconductor integrated circuit 500 according to a fifth preferred embodiment of the present invention. The semiconductor integrated circuit 500 measures consumption current in the memory circuit. The semiconductor integrated circuit 500 includes a memory circuit 510, a logic circuit 520, a pseudo test terminal 530, a plurality of external input terminals 531 through 534, an external output terminal 536, and a pseudo test signal switching circuit 540. In this example, the memory circuit 510 is the CUT.

The memory circuit 510 includes a plurality of internal input terminals 511 through 515, an internal output terminal 516 and an input switching circuit 517 and an output switching circuit 518. Chiefly, the configuration of the logic circuit 520 according to the fifth preferred embodiment is different from the configuration of the logic circuit 420 according to the fourth preferred embodiment. Furthermore, the semiconductor integrated circuit 500 includes the pseudo test signal switching circuit 540 unlikely with the semiconductor integrated circuit 400 according to the fourth preferred embodiment. Each of the external input terminals 531 through 534 and the memory circuit 510 that includes the internal input and output terminals 511 through 516 and the input and output switching circuits 517 and 518 includes the same configuration as each of the external input terminals 431 through 434 and the memory circuit 410 that includes the internal input terminals 411 through 415 and the input and output switching circuits 417 and 418 in the fourth preferred embodiment.

The pseudo test signal switching circuit 540 is coupled to the pseudo test terminal 530 so as to receive the pseudo test signal Spt and to the internal input terminal 515 of the memory circuit 510 so as to receive the internal test mode select signal iTMS. The pseudo test terminal 530 is also coupled to the logic circuit 520. That is, the pseudo test terminal 530 is used as an input-output terminal when the semiconductor integrated circuit 500 operates in the normal operational mode. Also, the pseudo test signal switching circuit 540 is coupled to the internal output terminal 516 of the memory circuit 510. The pseudo test signal switching circuit 540 provides the pseudo test signal Spt to the internal output terminal 516 when the internal test mode select signal iTMS is turned to the "H" level. On the other hand, when the internal test mode select signal iTMS is turned to the "L" level, the pseudo test signal switching circuit 540 makes the internal output terminal 516 to have the high impedance.

Figure 12:
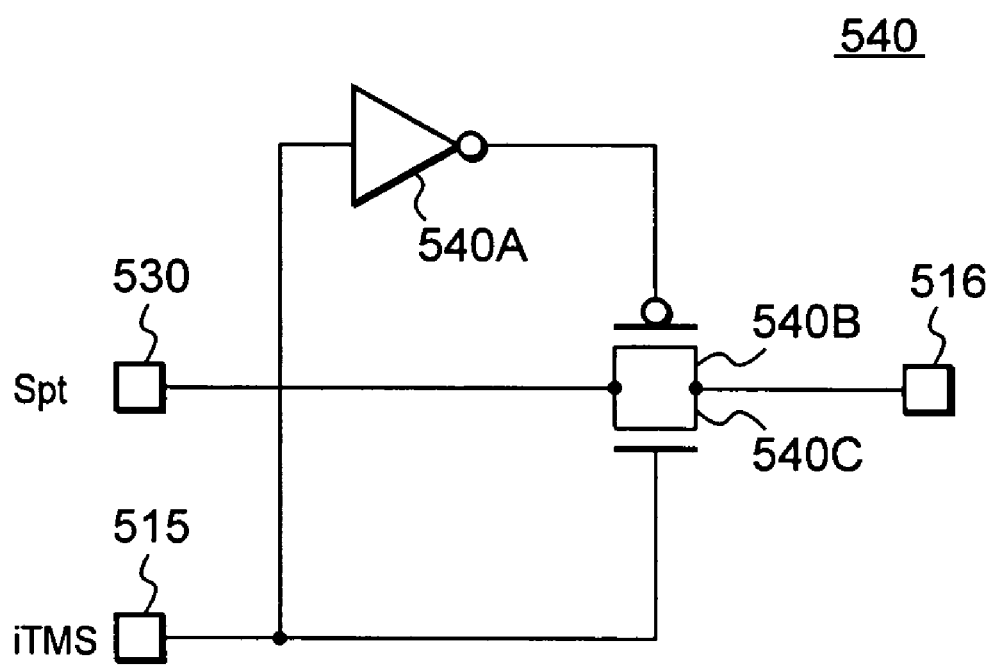
FIG. 12 is a schematic circuit diagram for describing the pseudo test signal switching circuit in the semiconductor integrated circuit in FIG. 11.

FIG. 12 is a schematic circuit diagram for describing the pseudo test signal switching circuit 540 in the semiconductor integrated circuit 500 in FIG. 11. As shown in FIG. 12, the pseudo test signal switching circuit 540 includes an inverter 540A, a PMOS transistor 540B and an NMOS transistor 540C. The inverter 540A includes an input node coupled to the internal input terminal 515 so as to receive the internal test mode select signal iTMS and then output an inverted internal test mode select signal iTMSb. The PMOS transistor 540B includes a source electrode coupled to the pseudo test terminal 530, a drain electrode coupled to the internal output terminal 516 and a gate electrode coupled to an output node of the inverter 540A. The NMOS transistor 540C includes a drain electrode coupled to the pseudo test terminal 530, a source electrode coupled to internal output terminal 516 and a gate electrode coupled to the internal input terminal 515.

The operation of the semiconductor integrated circuit 500 according to the fifth preferred embodiment of the present invention is described below. Before the consumption current in the memory circuit 510 is measured, the internal test mode select signal iTMS is turned to the "L" level by the logic circuit 520. On such an occasion as this, the input switching circuit 517 allows the inverted internal clock signal iCKb, the inverted internal write enable signal iWEb, the inverted internal read enable signal iREb and the inverted internal data input signal iDIb to be input to the internal of the memory circuit 510, and the output switching circuit 518 allows the internal data output signal iDO to be output from the memory circuit 510.

Then, the external clock signal eCK, the external write enable signal eWE, the external read enable signal eRE, and the external data input signal eDI, that are to be used when the semiconductor integrated circuit 500 operates in the normal operational mode, are input to the external input terminals 531 through 534. At this point, the pseudo test terminal 530 is kept in a floating state. Accordingly, the logic circuit 520 generates the internal clock signal iCK, the internal write enable signal iWE, the internal read enable signal iRE and the internal data input signal iDI for the memory circuit 510 based on the external clock signal eCK, the external write enable signal eWE, the external read enable signal eRE, and the external data input signal eDI, and the memory circuit 510 generates the internal data output signal iDO for the logic circuit 520 based on the internal clock signal iCK, the internal write enable signal iWE, the internal read enable signal iRE and the internal data input signal iDI. Also, when the internal test mode select signal iTMS is kept at the "L" level, the PMOS transistor 540B and the NMOS transistor 540C of the pseudo test signal switching circuit 540 are turned OFF. Therefore, the logic circuit 520 generates the external data output signal eDO based on the internal data output signal iDO. That is, the both the memory circuit 510 and the logic circuit 520 operate normally. As a result, when the internal test mode select signal iTMS is turned to the "L" level, the consumption current Icon in the semiconductor integrated circuit 500 is equal to a sum of the consumption current I1 in the memory circuit 510 and the consumption current I2 in the logic circuit 520.

Next, the internal test mode select signal iTMS is turned to the "H" level by the logic circuit 520. On such an occasion as this, the output nodes of the input switching circuit 517 and the internal output terminal 516 of the memory circuit 510 are kept to have the high impedances.

Then, the external clock signal eCK, the external write enable signal eWE, the external read enable signal eRE, and the external data input signal eDI, that are to be used when the semiconductor integrated circuit 500 operates in the normal operational mode, are input to the external input terminals 531 through 534. In this instance, the logic circuit 520 generates the internal clock signal iCK, the internal write enable signal iWE, the internal read enable signal iRE and the internal data input signal iDI for the memory circuit 510 based on the external clock signal eCK, the external write enable signal eWE, the external read enable signal eRE, and the external data input signal eDI. Also, since the internal test mode select signal iTMS is kept at the "H" level, the internal output terminal 516 of the memory circuit 510 is kept to have the high impedance by the output switching circuit 518 and the pseudo test signal Spt is input to the pseudo test terminal 530. Furthermore, when the internal test mode select signal iTMS is turned to the "H" level, the PMOS transistor 540B and the NMOS transistor 540C in the pseudo test signal switching circuit 540 are turned ON.

Therefore, the logic circuit 520 generates the external data output signal eDO based on the pseudo test signal Spt.

Also, since the output nodes of the input switching circuit 517 are kept to have the high impedances, the memory circuit 510 is in a non-action mode. That is, when the internal test mode select signal iTMS is turned to the "H" level, the logic circuit 520 operates normally and the memory circuit 510 is in the non-action mode. Therefore, the consumption current Icct in the semiconductor integrated circuit 500 is equal to the consumption current I2 in the logic circuit 520, when the internal test mode select signal iTMS is turned to the "H" level. As a result, the consumption current I1 in the memory circuit 510 can be obtained by a difference between the consumption current Iccn and the consumption current Icct.

According to the fifth preferred embodiment, the semiconductor integrated circuit includes the input switching circuit and the output switching circuit in the CUT (for example, the memory circuit) and further includes the pseudo test signal switching circuit to generate the external data output signal based on the pseudo test signal when the CUT is in the non-action mode. Therefore, the consumption current in the CUT can be easily and exactly measured. Also, since one input-output terminal of the logic circuit is used as the pseudo test terminal that receives the pseudo test signal, it can be suppressed to increase the number of the terminals of the semiconductor integrated circuit for the measurement of the consumption current in the CUT. Furthermore, according to the fifth preferred embodiment, since the semiconductor integrated circuit includes the pseudo test signal switching circuit, the consumption current in the CUT can be measured even after assembling a semiconductor device that includes the semiconductor integrated circuit.

Figure 13:
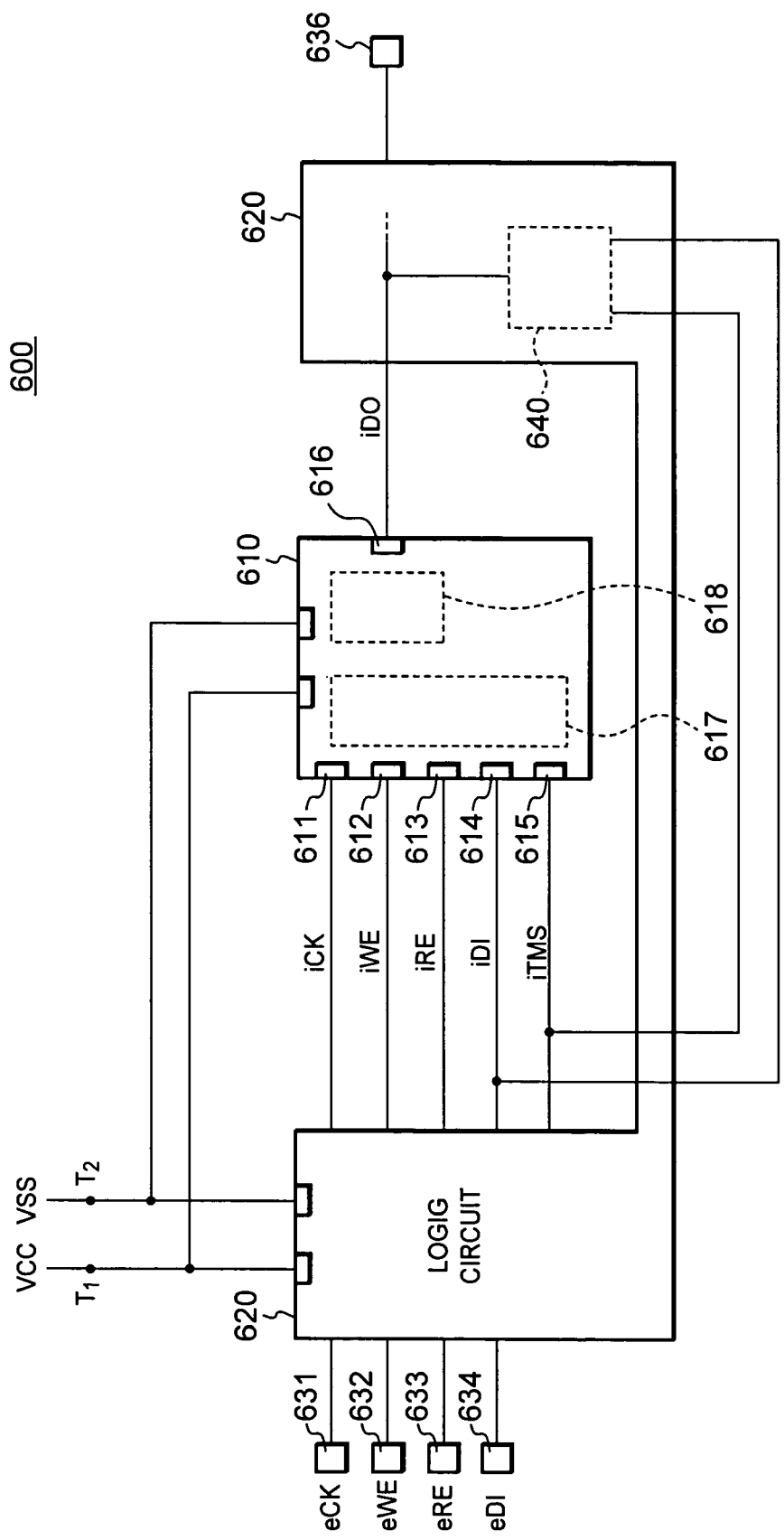
FIG. 13 is a schematic circuit diagram for describing a semiconductor integrated circuit according to a sixth preferred embodiment of the present invention.

FIG. 13 is a schematic circuit diagram for describing a semiconductor integrated circuit 600 according to a sixth preferred embodiment of the present invention. The semiconductor integrated circuit 600 measures consumption current in the memory circuit. The semiconductor integrated circuit 600 includes a memory circuit 610, a logic circuit 620, a plurality of external input terminals 631 through 634, an external output terminal 636, and a pseudo test signal generating circuit 640. In this example, the memory circuit 610 is the CUT.

The memory circuit 610 includes a plurality of internal input terminals 611 through 615, an internal output terminal 616 and an input switching circuit 617 and an output switching circuit 618. The semiconductor integrated circuit 600 includes the pseudo test signal generating circuit 640 unlikely with the semiconductor integrated circuit 400 according to the fourth preferred embodiment. The other configurations of the semiconductor integrated circuit 600 according to the sixth preferred embodiment are the same as those according to the fourth preferred embodiment.

The pseudo test signal generating circuit 640 is coupled to the internal input terminal 614 so as to receive the internal data input signal iDI and to the internal input terminal 615 so as to receive the internal test mode select signal iTMS. Also, the pseudo test signal generating circuit 640 is coupled to the internal output terminal 616 of the memory circuit 610. The pseudo test signal generating circuit 640 provides the pseudo test signal Spt to the internal output terminal 616 of the memory circuit 610 based on the internal data input signal iDI, when the internal test mode select signal iTMS is turned to the "H" level. On the other hand, when the internal test mode select signal iTMS is turned to the "L" level, the pseudo test signal generating circuit 640 makes the internal output terminal 616 to have the high impedance.

Figure 14:
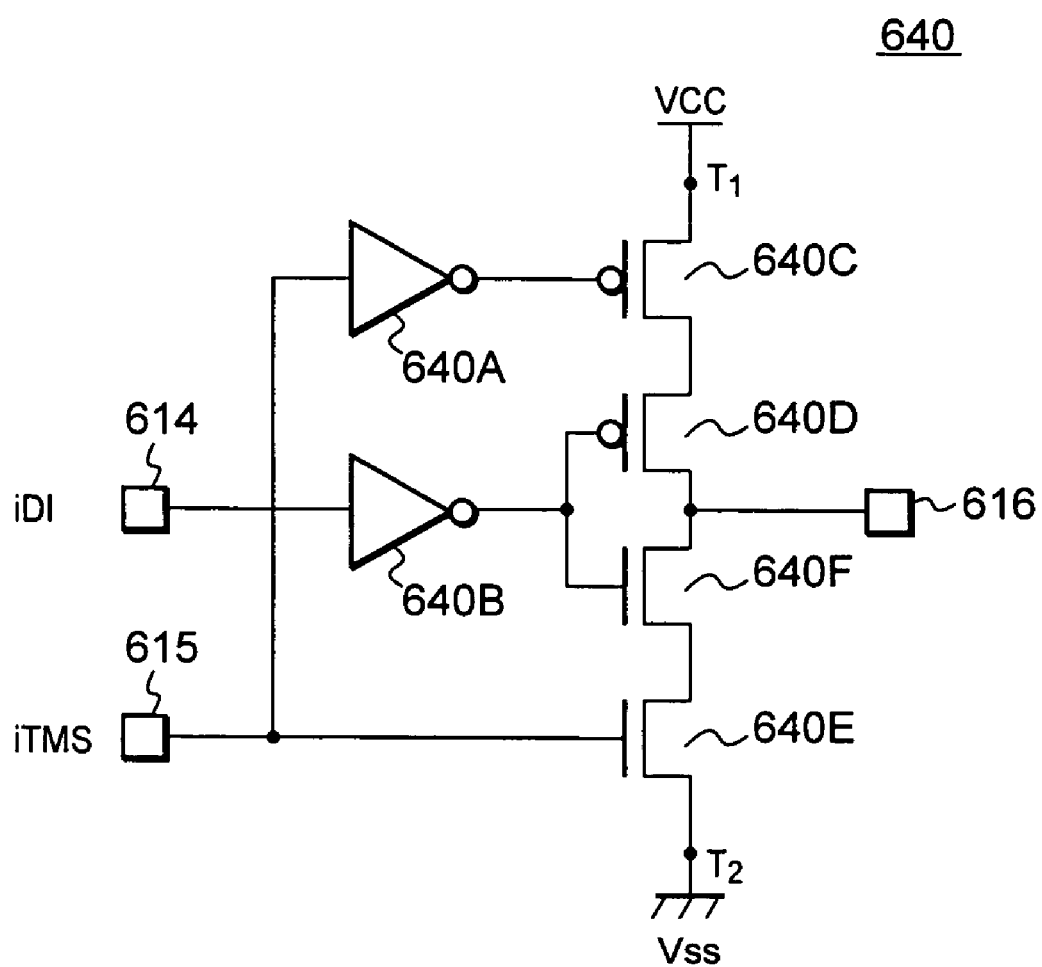
FIG. 14 is a schematic circuit diagram for describing the pseudo test signal generating circuit in the semiconductor integrated circuit in FIG. 13.

FIG. 14 is a schematic circuit diagram for describing the pseudo test signal generating circuit 640 in the semiconductor integrated circuit 600 in FIG. 13. As shown in FIG. 14, the pseudo test signal generating circuit 640 includes first and second inverters 640A and 640B, first and second PMOS transistors 640C and 640D, and first and second NMOS transistors 640E and 640F.

The first inverter 640A includes an input node coupled to the internal input terminal 615 so as to receive the internal test mode select signal iTMS and then output an inverted internal test mode select signal iTMSb the second inverter 640B includes an input node coupled to the internal input terminal 614 so as to receive the internal data input signal iDI and then outputs an inverted internal data input signal iDIb. The first PMOS transistor 640C includes a source electrode coupled to the first electrical source terminal T1 and a gate electrode coupled to an output node of the first inverter 640A. The second PMOS transistor 640D includes a source electrode coupled to a drain electrode of the first PMOS transistor 640C, a drain electrode coupled to the internal input terminal 616 of the memory circuit 610, and a gate electrode coupled to an output node of the second inverter 640B. The first NMOS transistor 640E includes a source electrode coupled to the second electrical source terminal T2 and a gate electrode coupled to the internal input terminal 615 so as to receive the internal test mode select signal iTMS. The NMOS transistor 640F includes a source electrode coupled to a drain electrode of the first NMOS transistor 640E, a drain electrode coupled to the internal input terminal 616 of the memory circuit 610, and a gate electrode coupled to the output node of the second inverter 640B.

The operation of the semiconductor integrated circuit 600 according to the sixth preferred embodiment of the present invention is described below. Before the consumption current in the memory circuit 610 is measured, the internal test mode select signal iTMS is turned to the "L" level by the logic circuit 620. On such an occasion as this, the input switching circuit 617 allows the inverted internal clock signal iCKb, the inverted internal write enable signal iWEb, the inverted internal read enable signal iREb and the inverted internal data input signal iDIb to be input to the memory circuit 610, and the output switching circuit 618 allows the internal data output signal iDO to be output from the memory circuit 610.

Then, the external clock signal eCK, the external write enable signal eWE, the external read enable signal eRE, and the external data input signal eDI, that are to be used when the semiconductor integrated circuit 600 operates in the normal operational mode, are input to the external input terminals 631 through 634. Accordingly, the logic circuit 620 generates the internal clock signal iCK, the internal write enable signal iWE, the internal read enable signal iRE and the internal data input signal iDI for the memory circuit 610 based on the external clock signal eCK, the external write enable signal eWE, the external read enable signal eRE, and the external data input signal eDI, and the memory circuit 610 generates the internal data output signal iDO for the logic circuit 620 based on the internal clock signal iCK, the internal write enable signal iWE, the internal read enable signal iRE and the internal data input signal iDI. Also, when the internal test mode select signal iTMS is kept at the "L" level, the first PMOS transistor 640C and the first NMOS transistor 640E of the pseudo test signal generating circuit 640 are turned OFF. Therefore, the logic circuit 620 generates the external data output signal eDO based on the internal data output signal iDO. That is, the both the memory circuit 610 and the logic circuit 620 operate normally. As a result, when the internal test mode select signal iTMS is turned to the "L" level, the consumption current Iccn in the semiconductor integrated circuit 600 is equal to a sum of the consumption current 11 in the memory circuit 610 and the consumption current 12 in the logic circuit 620.

Next, the internal test mode select signal iTMS is turned to the "H" level by the logic circuit 620. On such an occasion as this, the output nodes of the input switching circuit 617 and the internal output terminal 616 of the memory circuit 610 are kept to have the high impedances.

Then, the external clock signal eCK, the external write enable signal eWE, the external read enable signal eRE, and the external data input signal eDI, that are to be used when the semiconductor integrated circuit 600 operates in the normal operational mode, are input to the external input terminals 631 through 634. In this instance, the logic circuit 620 generates the internal clock signal iCK, the internal write enable signal iWE, the internal read enable signal iRE and the internal data input signal iDI for the memory circuit 610 based on the external clock signal eCK, the external write enable signal eWE, the external read enable signal eRE, and the external data input signal eDI. Also, since the internal test mode select signal iTMS is kept at the "H" level, the internal output terminal 616 of the memory circuit 610 is kept to have the high impedance by the output switching circuit 618. Furthermore, when the internal test mode select signal iTMS is turned to the "H" level, the first PMOS transistor 640C and the first NMOS transistor 640E in the pseudo test signal generating circuit 640 are turned ON. Therefore, the pseudo test signal generating circuit 640 provides the pseudo test signal Spt based on the internal data input signal iDI to the internal output terminal 616 of the memory circuit 610.

Also, since the output nodes of the input switching circuit 617 are kept to have the high impedances, the memory circuit 610 is in a non-action mode. That is, when the internal test mode select signal iTMS is turned to the "H" level, the logic circuit 620 operates normally and the memory circuit 610 is in the non-action mode. Therefore, the consumption current Icct in the semiconductor integrated circuit 600 is equal to the consumption current 12 in the logic circuit 620, when the internal test mode select signal iTMS is turned to the "H" level. As a result, the consumption current 11 in the memory circuit 610 can be obtained by a difference between the consumption current Iccn and the consumption current Icct.

According to the sixth preferred embodiment, the semiconductor integrated circuit includes the input switching circuit and the output switching circuit in the CUT (for example, the memory circuit) and further includes the pseudo test signal generating circuit to generate the pseudo test signal based on the internal data input signal when the CUT is in the non-action mode. Therefore, the consumption current in the CUT can be easily and exactly measured. Also, since the internal data input signal is used for generating the pseudo test signal, it can be suppressed to increase the number of the terminals of the semiconductor integrated circuit for the measurement of the consumption current in the CUT. Furthermore, according to the sixth preferred embodiment, since the semiconductor integrated circuit includes the pseudo test signal generating circuit, the consumption current in the CUT can be measured even after assembling a semiconductor device that includes the semiconductor integrated circuit.

What is claimed is:

1. A semiconductor integrated circuit, comprising:
    a first electrical source terminal which receives a first electrical source voltage;
    a second electrical source terminal which receives a second electrical source voltage lower than the first electrical source voltage;
    a plurality of external input terminals which receives a plurality of external test signals;
    a logic circuit, coupled to the external input terminals, which outputs a plurality of internal test signals based on the external test signals;
    a circuit under test (CUT), coupled to the logic circuit, which receives the internal test signals;
    a delay time measurement terminal from which a delay time measurement signal is output, wherein the delay time measurement signal is turned in accordance with a transition of one of the internal test signals;
    a current generator coupled between the first electrical source terminal and the delay time measurement terminal; and
    a plurality of delay time measurement transistors which are coupled in parallel between the delay time measurement terminal and the second electrical source terminal and which have a plurality of control electrodes, wherein the control electrodes of the delay time measurement transistors are coupled to the logic circuit to receive the internal test signals.

2. The semiconductor integrated circuit according to claim 1, wherein the delay time measurement terminal is a first delay time measurement terminal, the delay time measurement signal is a first delay time measurement signal, the constant-current circuit is a first constant-current circuit and the delay time measurement transistors are first delay time measurement transistors, wherein the CUT provides an internal test output signal to the logic circuit, wherein the logic circuit generates a test result output signal based on the internal test output signal, and wherein the semiconductor integrated circuit further comprises:
    a first delay time approximation transistor which is coupled between the first delay time measurement terminal and the second electrical source terminal and which is controlled by a test control signal;
    a second delay time measurement terminal from which a second delay time measurement signal is output;
    a second constant-current circuit coupled between the first electrical source terminal and the second delay time measurement terminal;
    a second delay measurement transistor which is coupled between the second delay time measurement terminal and the second electrical source terminal and which is controlled by the internal test output signal; and
    a second delay time approximation transistor which is coupled between the second delay time measurement terminal and the second electrical source terminal and which is controlled by the test control signal.

3. The semiconductor integrated circuit according to claim 2, wherein a delay time between the internal test signal and the first delay time measurement signal approximates a delay time between the test control signal and the first delay time measurement signal, and wherein a delay time between the internal test output signal and the test result output signal approximates a delay time between the test control signal and the second delay time measurement signal.

4. The semiconductor integrated circuit according to claim 1, further comprising:
 a switching circuit coupled between the delay time measurement terminal and the delay time measurement transistors, wherein the switching circuit is controlled by a test mode select signal.

5. The semiconductor integrated circuit according to claim 4, wherein the delay time measurement terminal is coupled to the logic circuit.

6. The semiconductor integrated circuit according to claim 4, wherein the switching circuit is an NMOS transistor having a gate electrode which receives the test mode select signal.

7. The semiconductor integrated circuit according to claim 1, wherein the CUT is a memory circuit.

8. The semiconductor integrated circuit according to claim 1, wherein the first electrical source voltage is a power supply voltage and the second electrical source voltage is a ground voltage.

* * * * *